United States Patent
Baheti et al.

(10) Patent No.: US 9,935,065 B1
(45) Date of Patent: Apr. 3, 2018

(54) RADIO FREQUENCY DEVICE PACKAGES AND METHODS OF FORMATION THEREOF

(71) Applicant: Infineon Technologies AG, Neubiberg (DE)

(72) Inventors: Ashutosh Baheti, München (DE); Saverio Trotta, München (DE); Werner Reiss, Raubling (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/387,307

(22) Filed: Dec. 21, 2016

(51) Int. Cl.
*H01L 23/00* (2006.01)
*H01L 23/66* (2006.01)
*H01L 23/31* (2006.01)
*H01L 21/50* (2006.01)
*H01L 21/56* (2006.01)
*H01L 23/528* (2006.01)
*H01L 21/60* (2006.01)

(52) U.S. Cl.
CPC .............. *H01L 23/66* (2013.01); *H01L 21/50* (2013.01); *H01L 21/565* (2013.01); *H01L 23/3135* (2013.01); *H01L 23/5286* (2013.01); *H01L 2021/60022* (2013.01); *H01L 2223/6644* (2013.01); *H01L 2223/6677* (2013.01)

(58) Field of Classification Search
CPC ...................................... H01L 23/66
See application file for complete search history.

(56) References Cited

U.S. PATENT DOCUMENTS

2006/0049995 A1\* 3/2006 Imaoka .................... H01Q 1/22
343/702
2008/0291115 A1\* 11/2008 Doan ...................... H01Q 1/38
343/893

OTHER PUBLICATIONS

Microwave Journal, "Single-Chip 24 GHz Radar Front End," Infineon Technologies AG, Feb. 13, 2014, 2 pages.

\* cited by examiner

*Primary Examiner* — William Harriston
(74) *Attorney, Agent, or Firm* — Slater Matsil, LLP

(57) ABSTRACT

A semiconductor device package includes an integrated circuit chip comprising a radio frequency device. The radio frequency device includes active circuitry at a first surface of the integrate circuit chip. An antenna substrate is disposed over the first surface of the integrated circuit. The antenna substrate includes a first conductive layer disposed over the first surface of the integrated circuit chip. The first conductive layer includes a first transmission line electrically coupled to the integrated circuit chip. A first laminate layer is disposed over the first conductive layer. The first laminate layer overlaps a first part of the first transmission line. A second conductive layer is disposed over the first laminate layer. The second conductive layer includes a first opening overlapping a second part of the first transmission line. A second laminate layer is disposed over the second conductive layer. A first antenna is disposed over the second laminate layer and overlaps the first opening, the second part of the first transmission line, and the integrated circuit chip.

28 Claims, 20 Drawing Sheets

RADIO FREQUENCY DEVICE PACKAGES AND METHODS OF FORMATION THEREOF

TECHNICAL FIELD

The present invention relates generally to a radio frequency electronic device, and, in particular embodiments, to radio frequency electronic device packages and the methods of formation thereof.

BACKGROUND

Portable devices such as tablets, smart phones, and smart watches have become popular recently due to the rapid advancement in low-cost semiconductor technologies. Radar sensors that can detect user motions (known as gesture sensors) may be configured in portable devices as an interface to control functionality of the device. Many portable devices are necessarily small so embedded radar systems with reduced form factors are desirable. Antenna elements embedded in a chip package of a radio frequency (RF) radar system account for a large percentage of the total package size. As a result, antenna location may be a priority during package design of integrated RF radar systems.

SUMMARY

In accordance with an embodiment of the invention, a semiconductor device package includes an integrated circuit chip comprising a radio frequency device. The radio frequency device includes active circuitry at a first surface of the integrate circuit chip. An antenna substrate is disposed over the first surface of the integrated circuit. The antenna substrate includes a first conductive layer disposed over the first surface of the integrated circuit chip. The first conductive layer includes a first transmission line electrically coupled to the integrated circuit chip. A first laminate layer is disposed over the first conductive layer. The first laminate layer overlaps a first part of the first transmission line. A second conductive layer is disposed over the first laminate layer. The second conductive layer includes a first opening overlapping a second part of the first transmission line. A second laminate layer is disposed over the second conductive layer. A first antenna is disposed over the second laminate layer and overlaps the first opening, the second part of the first transmission line, and the integrated circuit chip.

In accordance with another embodiment of the invention, a method of assembling a semiconductor device package includes forming an integrated circuit chip. The integrated circuit chip includes a radio frequency device. The radio frequency device includes active circuitry at a first surface of the integrated circuit chip. A first conductive layer is formed over the first surface of the integrated circuit chip. The first conductive layer is patterned to form a first transmission line electrically coupled to the integrated circuit chip. A first laminate layer is formed over the first conductive layer. The first laminate layer overlaps a first part of the first transmission line. A second conductive layer is formed over the first laminate layer. A first opening is formed in the second conductive layer. The first opening overlaps a second part of the first transmission line. A second laminate layer is formed over the second conductive layer. A first antenna is formed over the second laminate layer and overlaps the first opening, the second part of the first transmission line, and the integrated circuit chip.

In accordance with still another embodiment of the invention, a system includes a printed circuit board and an integrated circuit chip. The integrated circuit chip includes a radio frequency receiver, transmitter, or transceiver. The system further includes a first ground plane above the integrated circuit chip, a transmission slot in the first ground plane, and an antenna located above the first ground plane. The antenna overlaps the integrated circuit chip and is directly above the transmission slot. The system further includes a transmission line between the integrated circuit chip and the first ground plane. The transmission line is electrically coupled to the integrated circuit chip. The transmission line is electromagnetically coupled to the antenna.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A-2F illustrate an embodiment of fabricating a radio frequency device package in accordance with embodiments of the invention, wherein FIG. 2A illustrates a cross-sectional view of a radio frequency device package after forming an upper conductive layer over a first surface of an upper laminate layer and a conductive antenna layer over a second surface of the upper laminate layer, wherein FIG. 2B illustrates a cross-sectional view of the radio frequency device package after forming a lower laminate layer and a lower conductive layer over the upper conductive layer and the upper laminate layer, wherein FIG. 2C illustrates a cross-sectional view of the radio frequency device package after forming a solder mask over the lower laminate layer and the lower conductive layer and attaching an integrated circuit chip to the radio frequency device package using conductive pillars and an underfill layer, wherein FIG. 2D illustrates a cross-sectional view of the radio frequency device package after forming a molded compound region over the integrated circuit chip and the underfill layer, wherein FIG. 2E illustrates a cross-sectional view of the radio frequency device package after forming vias through the molded compound region and the underfill layer, and wherein FIG. 2F illustrates a cross-sectional view of the radio frequency device package after patterning the conductive antenna layer to form antennas over the upper laminate layer;

FIGS. 3A-3H illustrate an alternative embodiment of fabricating a radio frequency device package in accordance with embodiments of the invention, wherein FIG. 3A illustrates a cross-sectional view of the radio frequency device package after forming a molded compound region around an integrated circuit chip, wherein FIG. 3B illustrates a cross-sectional view of the radio frequency device package after forming an underfill layer, wherein FIG. 3C illustrates a cross-sectional view of the radio frequency device package after forming conductive pillars in the underfill layer, wherein FIG. 3D illustrates a cross-sectional view of the radio frequency device package after forming the lower conductive layer, wherein FIG. 3E illustrates a cross-sectional view of the radio frequency device package after patterning the lower conductive layer, wherein FIG. 3F illustrates a cross-sectional view of the radio frequency device package after forming a solder mask over the underfill layer and forming an upper conductive layer and a lower laminate layer over the solder mask and the lower conductive layer, wherein FIG. 3G illustrates a cross-sectional view of the radio frequency device package after patterning the upper conductive layer, and wherein FIG. 3H illustrates a cross-sectional view of the radio frequency device package after forming a conductive antenna layer and an upper laminate layer over the upper conductive layer;

FIGS. 5A-5F illustrate another alternative embodiment of fabricating a radio frequency device package in accordance with embodiments of the invention, wherein FIG. 5A illustrates a cross-sectional view of the radio frequency device package after attaching a molded compound region and an integrated circuit chip to a lower conductive layer on an adhesive layer on a carrier using an underfill layer, wherein FIG. 5B illustrates a cross-sectional view of the radio frequency device package after detaching the adhesive layer and the carrier, patterning the lower conductive layer, and subsequently forming vias in the underfill layer and the lower conductive layer over the integrated circuit chip, wherein FIG. 5C illustrates a cross-sectional view of the radio frequency device package after forming middle conductive layer and a lower laminate layer over the lower conductive layer, patterning the middle conductive layer, and subsequently forming vias in the middle conductive layer, the lower laminate layer, and the underfill layer over the integrated circuit chip, wherein FIG. 5D illustrates a cross-sectional view of the radio frequency device package after forming an upper conductive layer and a middle laminate layer over the middle conductive layer and patterning the upper conductive layer, wherein FIG. 5E illustrates a cross-sectional view of the radio frequency device package after forming a conductive antenna layer and an upper laminate layer and patterning the conductive antenna layer to form antennas over the upper laminate layer, and wherein FIG. 5F illustrates a cross-sectional view of the radio frequency device package after forming vias in the middle laminate layer, the lower laminate layer, the underfill layer, and the molded compound region;

FIGS. 6A and 6B illustrate still another alternative embodiment of fabricating a radio frequency device package in accordance with an embodiment of the invention, wherein FIG. 6A illustrates a cross-sectional view of the radio frequency device package after forming a second conductive antenna layer and a second upper laminate layer and patterning the second conductive antenna layer to form additional antennas over the second upper laminate layer, and wherein FIG. 6B illustrates a cross-sectional view of the radio frequency device package after forming vias in the middle laminate layer, the lower laminate layer, the underfill layer, and the molded compound region;

FIGS. 7A-7C illustrate yet another alternative embodiment of fabricating a radio frequency device package in accordance with an embodiment of the invention, wherein FIG. 7A illustrates a cross-sectional view of the radio frequency device package after forming an upper laminate layer with a cavity over the upper conductive layer, wherein FIG. 7B illustrates a cross-sectional view of the radio frequency device package after forming a conductive antenna layer on a second upper laminate layer, patterning the conductive antenna layer to form antennas, and attaching the second upper laminate layer over the upper laminate layer, and wherein FIG. 7C illustrates a cross-sectional view of the radio frequency device package after forming vias in the middle laminate layer, the lower laminate layer, the underfill layer, and the molded compound region;

FIGS. 8A-8C illustrate several embodiments of a radio frequency device package in accordance with embodiments of the invention, wherein FIG. 8A illustrates a top view of an embodiment of a radio frequency device package, wherein FIG. 8B illustrates a top view of an alternative embodiment of a radio frequency device package, and wherein FIG. 8C illustrates a top view of another alternative embodiment of a radio frequency device package.

Figure 1:
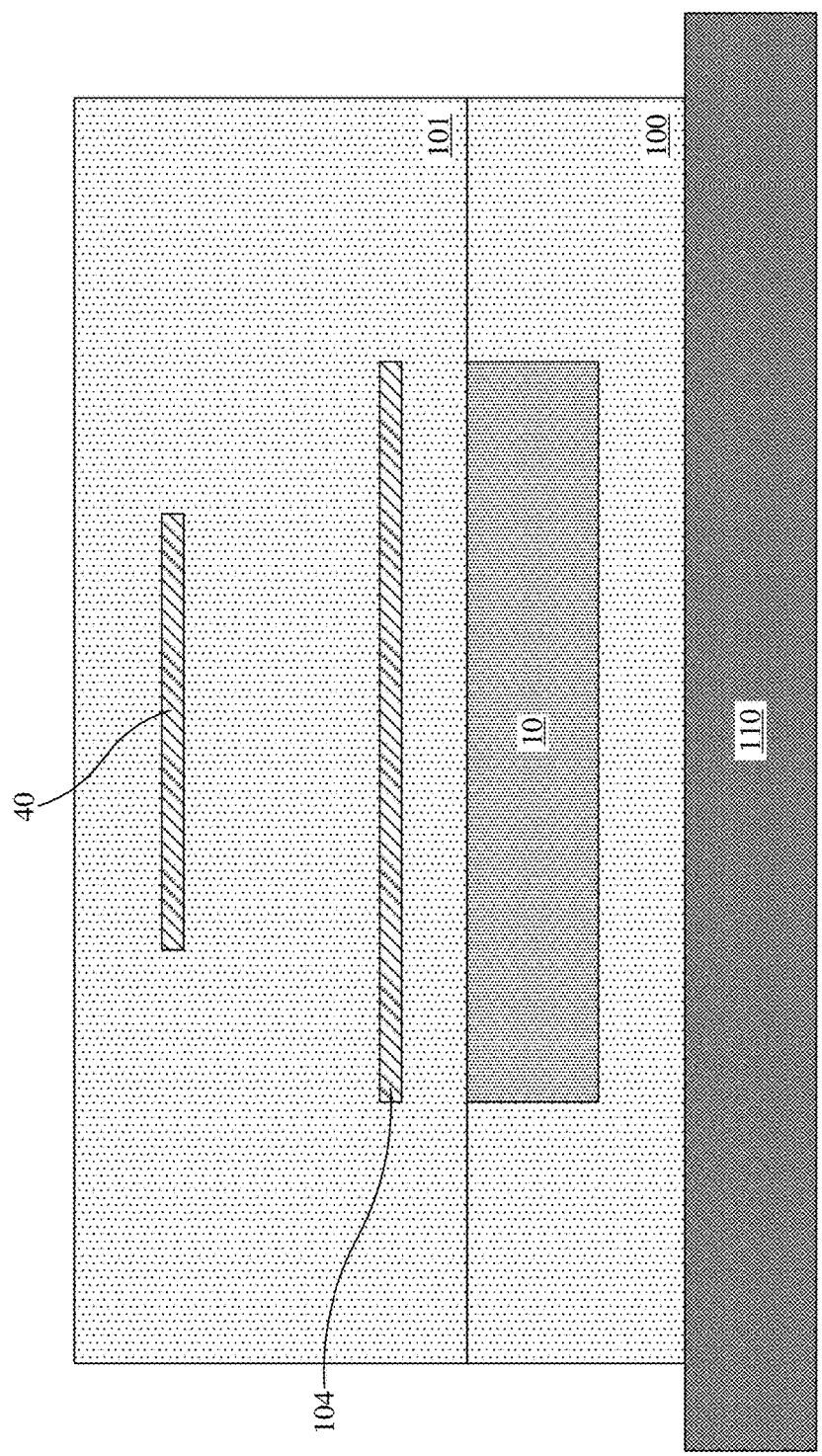
FIG. 1 illustrates an embodiment of a radio frequency device package.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Multiple antenna elements are used in a number of applications such as automotive radar, industrial radar, gesture sensors, and motion detectors. Sensing applications include level monitoring in storage tanks, smart lighting control, security systems, intelligent door openers, and collision avoidance in vehicles, among others. Multichannel radar systems are primarily used instead of single-channel systems when detection of the angular position of an object is important. In telecommunication applications, for example, in applications that use high frequencies such as $5^{th}$ generation (5G) mobile technologies at 28 GHz, multichannel transceivers may be used for point-to-point communication where beam forming is needed.

In a multichannel implementation such as a gesture sensor system that has multiple antenna elements, the size and spacing of the antenna elements are based on the desired operational frequency. For example, at 60 GHz, the distance between two antenna elements may be 3 to 3.5 mm. Fan-out packaging may be used to integrate antenna elements into the radio frequency device packaging. That is, fan-out packaging may be used for a radio frequency device package containing integrated antenna elements, an integrated circuit chip including circuits designed to receive, process, and transmit radio frequency signals, and various transmission lines and interconnects to couple the components together.

However, the large size of the final device package may be prohibitive for some applications. Additionally, a specific ground plane definition may be required on the printed circuit board (PCB) further restricting design considerations.

In other words, the package design restricts the PCB design because components such as the antenna elements, integrated circuit chips, and transmission lines have size requirements based on the desired operation. When these components are arranged linearly on the PCB, the size of the PCB is dictated by the components. The following embodiments provide various advantages over conventional radio frequency device packages by integrating components in a three-dimensional (3D) arrangement on the PCB.

Embodiments of the invention provided below describe various methods of fabricating radio frequency device packages, in particular, laminate package with integrated antenna, that have advantages over conventional radio frequency device packages. The following description describes the various embodiments. An embodiment of a radio frequency device package will be described using FIG. 1. An embodiment for fabricating a radio frequency device package will be described using FIG. 2. Various alternative embodiments for fabricating a radio frequency device package will be described using FIGS. 3-7. Several embodiment radio frequency device packages will be described using FIG. 8. An embodiment radiation pattern of a radio frequency device package will be described using FIG. 9.

FIG. 1 illustrates an embodiment of a radio frequency device package in accordance with embodiments of the invention.

Referring to FIG. 1, an integrated circuit chip 10 is disposed in a first package region 100. In various embodiments, the integrated circuit chip 10 includes a semiconductor substrate. In one embodiment, the semiconductor substrate includes silicon. In another embodiment, the semiconductor substrate includes silicon germanium (SiGe). In still another embodiment, the semiconductor substrate includes gallium arsenide (GaAs).

The integrated circuit chip 10 may include active and passive devices, metal layers, dielectric layers, doped and intrinsic semiconductor regions, and redistribution layers as well as other components known in the art. In various embodiments, the integrated circuit chip 10 has already undergone back end of line (BEOL) processing before forming the first package region 100.

The first package region 100 may include a suitable packaging material such as a plastic, epoxy, resin or other suitable material. The first package region 100 may enclose the integrated circuit chip 10 on all sides, or may leave top and/or bottom surfaces of the integrated circuit hip 10 exposed. Portions of the first package region 100 may also be subsequently removed to expose regions of the integrated circuit chip 10 as needed.

Still referring to FIG. 1, the radio frequency device package also includes a ground plane 104 and an antenna 40 disposed in a second package region 101. In various embodiments, the ground plane 104 and the antenna 40 overlap the integrated circuit chip 10. In other embodiments, the ground plane 104 and the antenna 40 are located directly over the integrated circuit chip 10.

In various embodiments, the ground plane 104 comprises a conductive material. Although the ground plane 104 as illustrated is the same width as the integrated circuit chip 10, the extent of the ground plane 104 may be greater than or less than that of the integrated circuit chip 10. In some embodiments, the radio frequency device package includes additional ground planes.

In various embodiments, the radio frequency device package includes additional antennas. The additional antennas may be located directly over or partially overlapping the integrated circuit chip. Some of the additional antennas may not overlap the integrated circuit chip 10. The antenna 40 may be configured to transmit and/or receive radio signals and may be electromagnetically coupled to circuitry located in the integrated circuit chip 10.

The second package region 101 may comprise similar materials as the first package region 100. Although the antenna 40 is illustrated as encapsulated by the second package region 101, the antenna 40 may also be exposed at the top of the radio frequency device package. Additionally, the second package region 101 may be formed concurrently with the first package region 100. The second package region 101 may extend to the sides of the first package region 100 as illustrated, or may be a different width. In various embodiments, the second package region 101 comprises laminate layers separating the integrated circuit chip 10, the ground plane 104, and the antenna 40. The first package region 100 and/or the second package region 101 may also comprise antenna feedings.

Still referring to FIG. 1, the first package region 100 is attached to an external support 110. The external support 110 may be a printed circuit board (PCB) or other suitable planar structure. The external support 110 may include additional circuits to connect the radio frequency device to other components connected to the external support 110. In various embodiments, vias may be included in the first package region 100 and/or the second package region 101 to couple the integrated circuit chip 10, ground plane 104, and antenna 40 to circuits located on the external support 110.

The external support 110 may include additional ground planes separate or connected to the ground plane 104. Additional device packages may also be included on the external support 110. The relative sizes of features in the radio frequency device package are not limited to the illustrated configuration. The external support 110 may be larger or smaller than illustrated in FIG. 1.

FIGS. 2A-2F illustrate an embodiment of fabricating a radio frequency device package in accordance with embodiments of the invention.

Figure 2A:
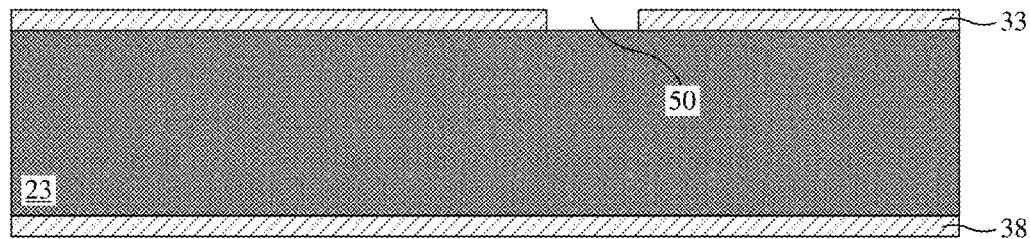

FIG. 2A illustrates a cross-sectional view of a radio frequency device package after forming an upper conductive layer over a first surface of an upper laminate layer and a conductive antenna layer over a second surface of the upper laminate layer.

Referring to FIG. 2A, an upper conductive layer 33 is formed over a first surface of an upper laminate layer 23 and a conductive antenna layer 38 is formed over a second surface of the upper laminate layer 23. The upper conductive layer 33 may then be patterned using an etching technique to form openings 50. In various embodiments, the upper conductive layer 33 may be a ground plane.

The upper conductive layer 33 and conductive antenna layer 38 may comprise a metal foil, metal layer, or metallization that has been laminated to the upper laminate layer 23. In one embodiment, the upper conductive layer 33 is copper (Cu). In one embodiment, the conductive antenna layer 38 is copper (Cu).

The upper laminate layer 23 may comprise a low-loss high frequency material such as a woven glass reinforced hydrocarbon ceramic and/or polytetrafluoroethylene (PTFE), for example. In one embodiment, the upper laminate layer 23 comprises RO4003. In another embodiment, the upper laminate layer 23 comprises RO4350. In various embodiments, the upper laminate layer 23 may be commercial laminate material manufactured with copper cladding on one or both surfaces.

The vertical thickness of the upper laminate layer 23 may be between 200 and 500 µm in various embodiments. In one embodiment, the vertical thickness of the upper laminate layer 23 is about 400 µm. The vertical thickness of the upper laminate layer 23 may be chosen such that the desired bandwidth of subsequently formed antennas is achieved.

Figure 2B:
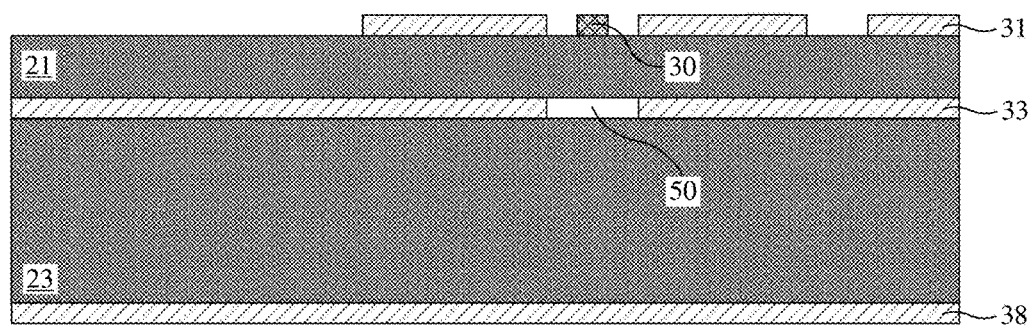

FIG. 2B illustrates a cross-sectional view of the radio frequency device package after forming a lower laminate layer and a lower conductive layer over the upper conductive layer and the upper laminate layer.

Referring to FIG. 2B, a lower laminate layer 21 and lower conductive layer 31 are formed over the upper conductive layer 33. In various embodiments, the lower laminate layer 21 and the lower conductive layer 33 may be formed over the upper conductive layer 33 by stacking the layers. The lower conductive layer 31 may then be patterned using an etching technique to form electronic leads and transmission lines 30. In various embodiments the openings 50 are vertically aligned with portions of the transmission lines 30. The lower conductive layer 31 may comprise a similar material as the upper conductive layer 33 and the conductive antenna layer 38 as previously described. In one embodiment, the lower conductive layer 31 comprises copper (Cu).

The vertical thickness of the lower laminate layer 21 may be between 100 and 300 µm in various embodiments. In one embodiment, the vertical thickness of the lower laminate layer 21 is about 200 µm. The vertical thickness of the lower laminate layer 21 may be chosen to optimize transmission line properties in the lower conductive layer 31. In various embodiments, the width of the transmission lines 30 may be between 50 and 300 µm. In one embodiment, the width of the transmission lines 30 is about 90 µm. In another embodiment, the width of the transmission lines 30 is about 200 µm. In some configurations, a transmission line may be referred to as an antenna feeding.

One type of laminate material that may be used to form conductive layers and laminate layers as described above and in the following is copper clad laminate. Sheets of copper clad laminate material may be fabricated as single-sided or double-sided copper clad sheets. During the fabrication process, copper sheets may be placed on one or both sides of the laminate material. Some combination of heat and pressure may then be applied to facilitate attachment of the copper sheets to the laminate material. It should be noted that in some cases it may be advantageous to use double-sided copper clad laminate material to form the laminate layers discussed previously and in future embodiments even when only a single conductive layer is needed. The unneeded conductive surface on the double-sided copper clad laminate is then etched off prior to lamination to a substrate. A possible benefit of etching a conductive layer off of a laminate material prior to lamination may be to improve adhesion to a substrate.

A conductive layer on a surface of a laminate material such as the lower laminate layer 21 may be an electrodeposited (ED) foil or a rolled foil, for example. A rolled foil sheet may be produced by repeatedly feeding the foil sheet through rollers to evenly reduce the thickness of the foil sheet. ED foil may be more rigid and have a different grain structure. In contrast, rolled foil may be smooth and flexible. In some cases, rolled foil may be advantageous in radio frequency (RF) applications, due to decreased surface roughness.

Figure 2C:
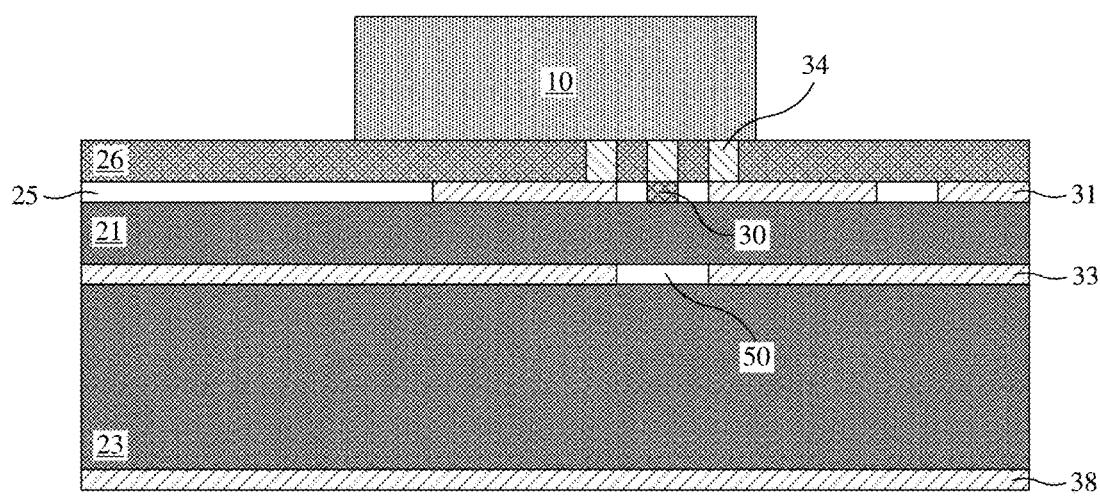

FIG. 2C illustrates a cross-sectional view of the radio frequency device package after forming a solder mask over the lower laminate layer and the lower conductive layer and attaching an integrated circuit chip to the radio frequency device package using conductive pillars and an underfill layer.

Referring to FIG. 2C, a solder mask 25 is formed over the lower laminate layer 21. The solder mask 25 may be formed using silk screen techniques, lithographic techniques, or other suitable means. The solder mask 25 may comprise an epoxy liquid, a liquid photoimageable solder mask (LPSM) ink, or a dry film photoimageable solder mask (DFSM) material, for example. Openings may be formed in the solder mask 25 to expose regions of the lower conductive layer 31.

The integrated circuit chip 10 may be placed using a pick and place process over the lower conductive layer 31 such that the conductive pillars 34 make electrical contact with exposed regions of the lower conductive layer 31 through the openings in the solder mask 25. The integrated circuit chip 10 may then be attached to the lower conductive layer 31 through well-known processes used with surface mount technology (SMT). For example, the integrated circuit chip 10 may be attached using a reflow soldering process during which the radio frequency device package may be subjected to controlled heat.

An underfill layer 26, which is an insulating material, may be injected or otherwise introduced to the area between the solder mask 25, lower conductive layer 31, and the integrated circuit chip 10. The underfill layer 26 may comprise a polymer material such as a filled epoxy. In one embodiment, the underfill layer 26 is formed using a capillary process. In another embodiment, the underfill layer 26 and the soldering process used to attach the integrated circuit chip 10 are combined by including fluxing chemistry in the underfill material. In this embodiment, the underfill material may liquefy during the reflow process providing a fluxing effect. The underfill material may then solidify and cure during the reflow process or require a separate curing step. In one embodiment, the underfill material may be applied to the wafer of the integrated circuit chip 10 before dicing.

The underfill layer 26 may surround and protect the conductive pillars 34. The underfill layer 26 may reduce strain on the solder joints by bonding the integrate circuit chip 10 to the lower laminate layer 21. Strain on the solder joints may be due to a variety of factors such as increased size of the integrated circuit chip 10 or increased mismatch of the coefficient of thermal expansion between the integrated circuit chip 10 and the lower laminate layer 21. In some cases, the underfill layer 26 may be omitted.

The underfill layer 26 may also advantageously separate the integrated circuit chip 10 from the lower conductive layer 31. In the absence of a sufficiently thick underfill layer, transmission lines located on the integrated circuit chip 10 may be affected by the lower conductive layer 31. In various embodiments, the thickness of the underfill layer 26 is between 25 µm and 75 µm. In one embodiment, the thickness of the underfill layer 26 is about 45 µm.

The integrated circuit chip 10 may contain radio frequency circuitry. In various embodiments, the radio frequency circuitry is designed to operate in a super high frequency (SHF) or an extremely high frequency (EHF) regime. For example, the integrated circuit chip 10 may contain millimeter wave (MMW) circuitry designed to operate in the unlicensed band from 57 GHz to 64 GHz. The integrate circuit chip may have a receive interface connected to receiving antennas and/or a transmit interface connected to transmitting antennas. The receiving and transmitting antennas may be disposed in or on various layers of the radio frequency device package coupled to the respective interfaces using transmission lines also located in the radio frequency device package. The integrated circuit chip 10 may also include redistribution (RDL) layers to redistribute connections to allow coupling to the lower conductive layer 31.

Figure 2D:
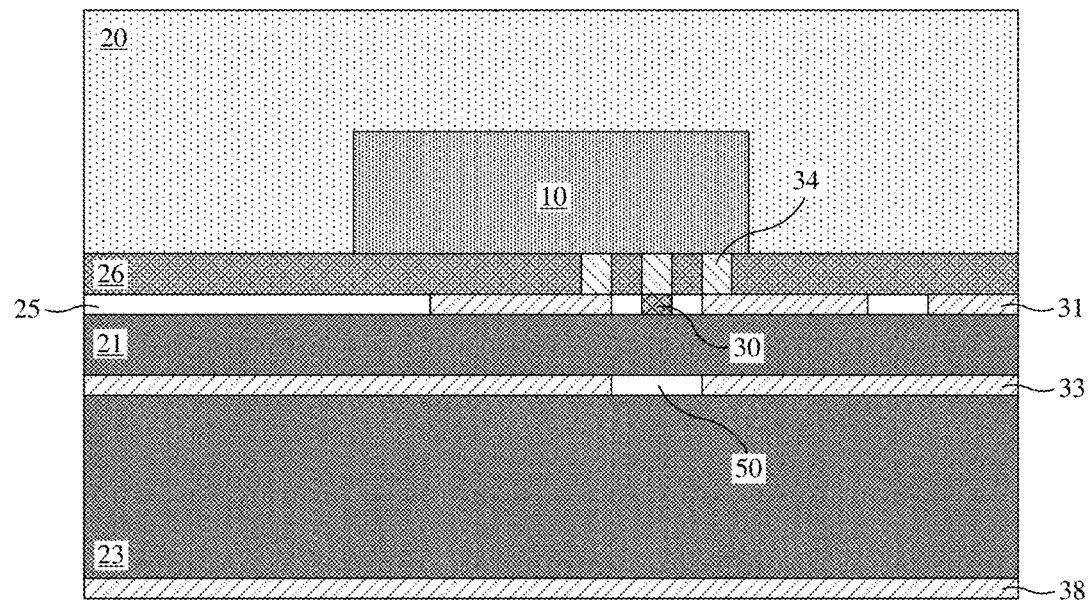

FIG. 2D illustrates a cross-sectional view of the radio frequency device package after forming a molded compound region over the integrated circuit chip and the underfill layer.

Referring to FIG. 2D, a molded compound region 20 is formed over the integrated circuit chip 10 and the underfill layer 26 using, for example, a pellet of a molding compound and a molding tool. The molded compound region 20 may encapsulate and protect the integrated circuit chip 10. The molded compound region 20 may serve to enlarge the area of the radio frequency device package so that it may be subsequently attached to a printed circuit board (PCB) using a technology that requires a larger pitch between connectors such as a ball grid array (BGA). The molded compound region 20 may comprise an epoxy resin material. In various embodiments, the molded compound region comprises a thermoset resin such as a bismaleimide-triazine resin (BT-Epoxy). In various embodiments, the molded compound region 20 comprises a glass-reinforced epoxy such as an FR-4 class material. The molded compound region 20 may be a specific implementation of the first package region 100 illustrated in FIG. 1.

Figure 2E:
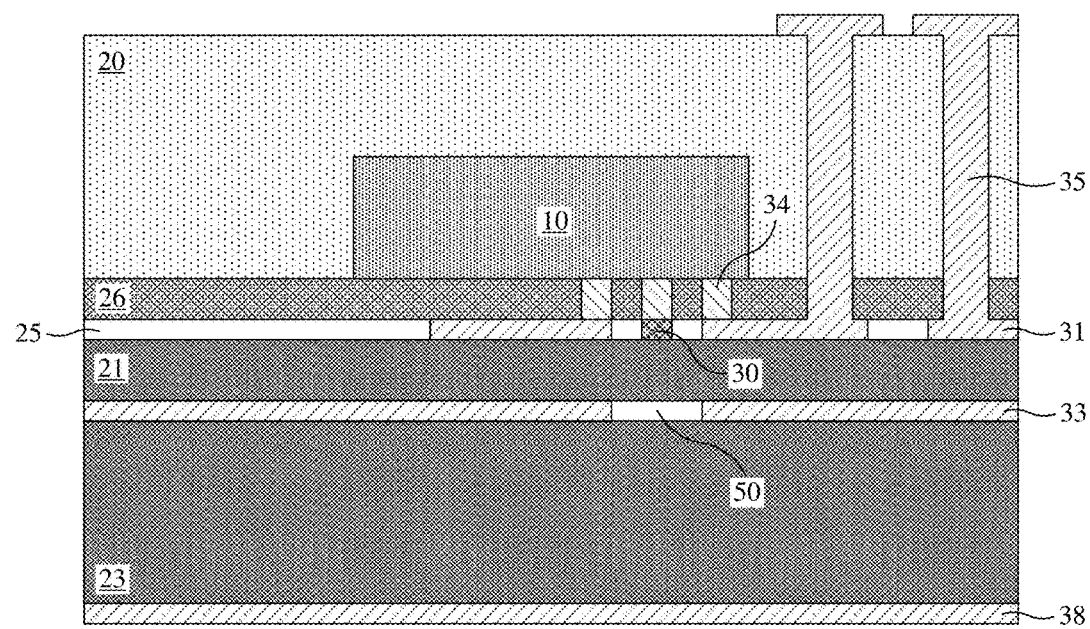

FIG. 2E illustrates a cross-sectional view of the radio frequency device package after forming vias through the molded compound region and the underfill layer. These vias may then be routed to form pads that allow electrical connections with a printed circuit board (PCB).

Referring to FIG. 2E, vias 35 are formed in the molded compound region 20 and the underfill layer 26 to provide electrical coupling between the lower conductive layer 31 and an exposed surface of the molded compound region 20. The contact points at the exposed surface may be used to make connections to a printed circuit board (PCB) using a ball grid array (BGA), for example. The vias 35 may be formed using a laser drilling process followed by electroplating with a conductive material. In various embodiments, the vias 35 comprise a metal and, in one embodiment, comprise copper (Cu).

Figure 2F:
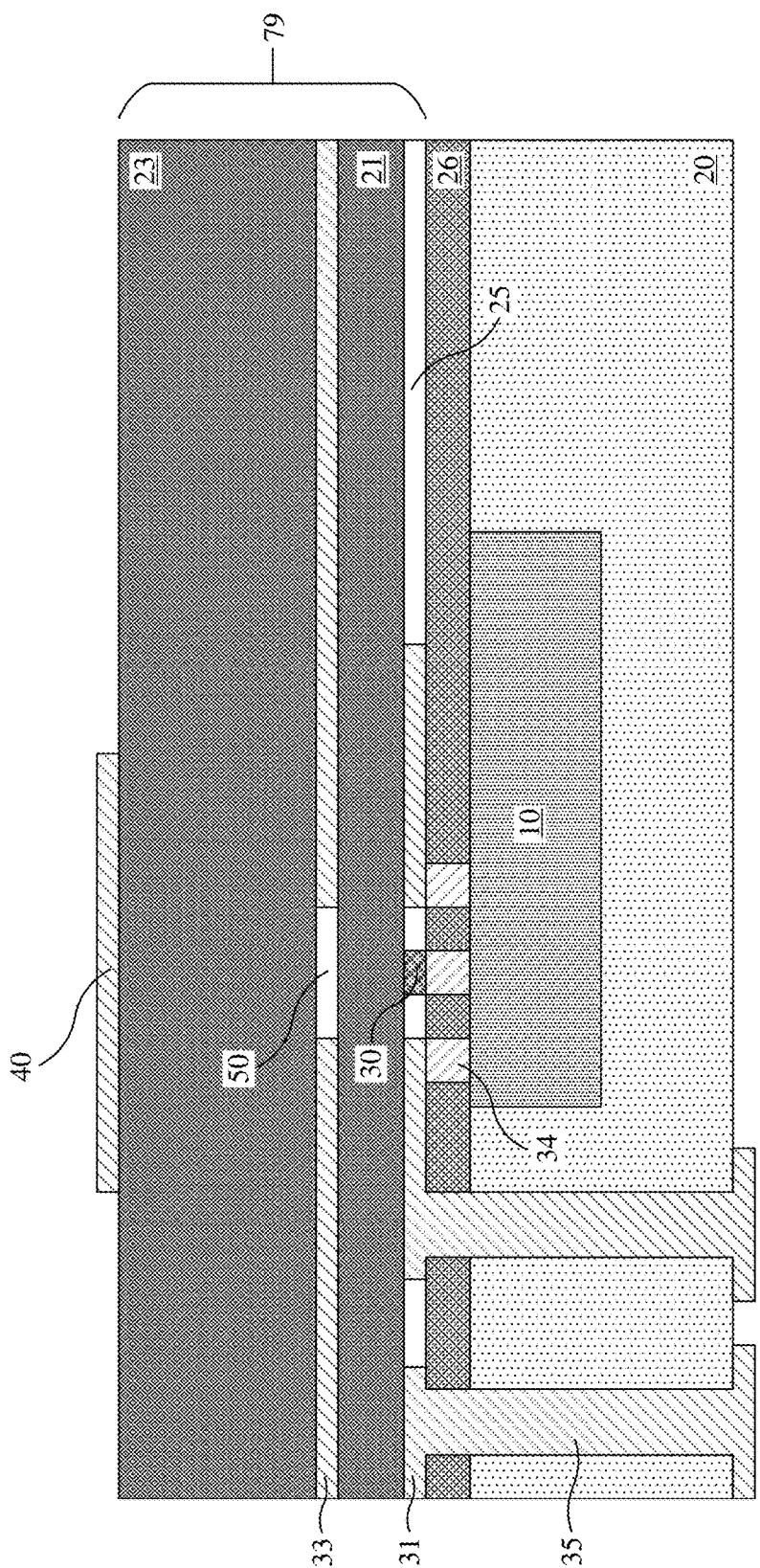

FIG. 2F illustrates a cross-sectional view of the radio frequency device package after patterning the conductive antenna layer to form antennas over the upper laminate layer.

Referring to FIG. 2F, the conductive antenna layer is patterned using an etching technique or other suitable process to form antennas 40 over the upper laminate layer 23. The formation of antennas 40 may take place at any point during the fabrication of the radio frequency device package. For example, it may be convenient to use a double-sided copper clad laminate layer during the processing stage described in FIG. 2A. In this case, the conductive antenna layer may be present on upper laminate layer 23 throughout the fabrication process as shown in FIGS. 2A-2E. The antennas 40 could then be conceivably formed first or at any other convenient time during fabrication.

Dimensions of the antennas 40 may be determined by a desired response to a specific wavelength or grouping of wavelengths (e.g. frequency band). In various embodiments, an antenna sensitive to millimeter wavelength radiation may have a length and width between 1 mm and 2.5 mm. In one embodiment, the length of the antenna is about 1.5 mm and the width of the antenna is about 850 um. In an alternative embodiment, the length of the antenna is about 1.3 mm and the width of the antenna is about 1.2 mm.

The antenna may be electromagnetically coupled to an opening positioned beneath the antenna. The size of the opening may also be determined by the desired wavelength response. The width of the opening may be between 100 µm and 300 µm in various embodiments. In one embodiment, the width of the opening may be about 150 µm. The length of the opening may be between 1 mm and 2 mm in various embodiments. In one embodiment, the length of the opening may be about 1.2 mm.

In some embodiments, the combination of the lower conductive layer 31, lower laminate layer 21, upper conductive layer 33, and upper laminate layer 23 may be considered an antenna substrate 79. The antenna substrate 79 may also include additional conductive, dielectric, or packaging elements.

This radio frequency device package described in previous and future embodiments may have benefits such as reduced overall package size and simplified manufacturing processes compared to conventional enhanced wafer level ball grid array (eWLB) packages and advanced thin small leadless packages (ATSLP). Additionally, the radio frequency device may have improved bandwidth capabilities because of the configuration of the transmission lines 30, antennas 40, and openings 50.

FIGS. 3A-3F illustrate an alternative embodiment of fabricating a radio frequency device package in accordance with embodiments of the invention. In contrast to previously described embodiments, a molded compound region may be formed around an integrated circuit chip before the formation of laminate layers and conductive layers of the device packaging.

Figure 3A:
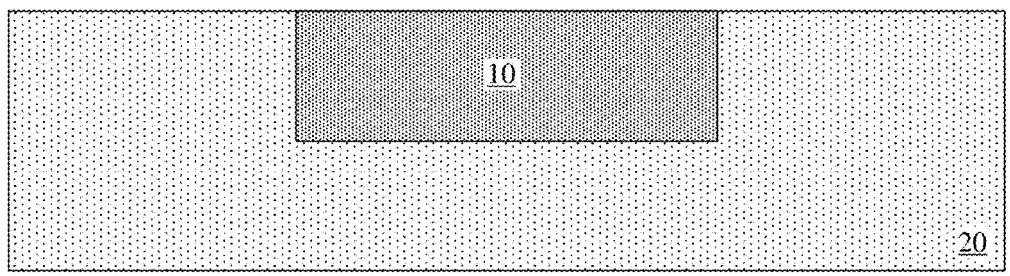

FIG. 3A illustrates a cross-sectional view of the radio frequency device package after forming a molded compound region around an integrated circuit chip.

Referring to FIG. 3A, a molded compound region 20 is formed around an integrated circuit chip 10. The integrated circuit chip 10 may be as previously described in reference to FIGS. 1 and 2C. In various embodiments, the integrated circuit chip 10 has already undergone back end of line (BEOL) processing and has been diced to create an individual die. The integrated circuit chip 10 may then be placed in a mold. A molding compound may be injected or otherwise introduced into the mold and subsequently cured to form the molded compound region 20. The molded compound region 20 may comprise a material as previously described in reference to FIG. 2D. In various embodiments, the molded compound region 20 is a specific implementation of the first package region 100 illustrated in FIG. 1.

Figure 3B:
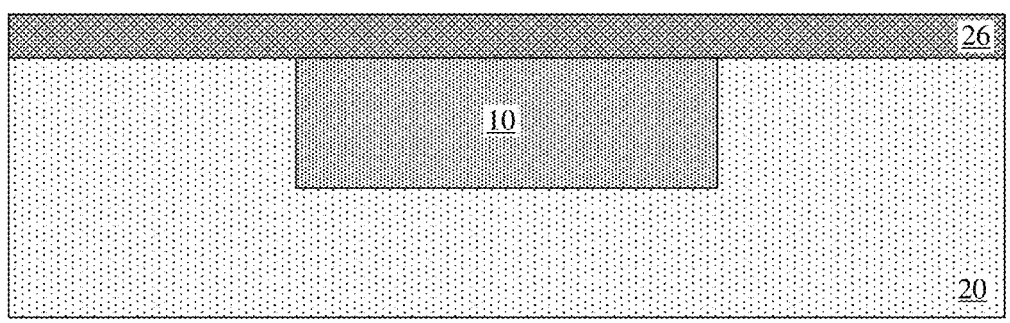

FIG. 3B illustrates a cross-sectional view of the radio frequency device package after forming an underfill layer.

Referring to FIG. 3B, an underfill layer 26 is formed over the integrated circuit chip 10. In some embodiments, the underfill layer 26 may cover a surface of the molded compound region 20. In various embodiments, the underfill layer 26 comprises a dielectric material.

Figure 3C:
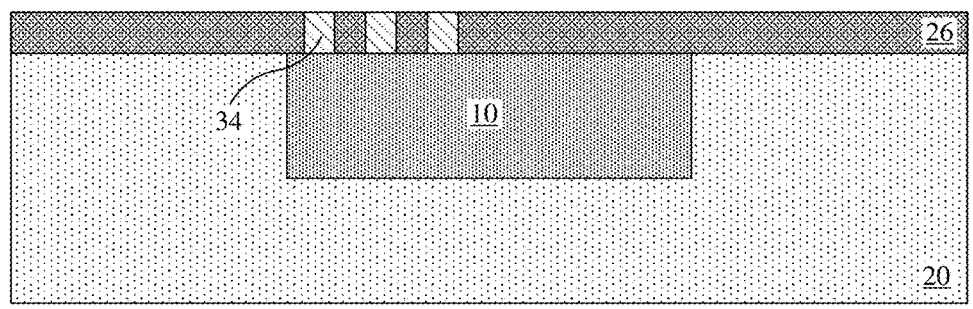

FIG. 3C illustrates a cross-sectional view of the radio frequency device package after forming conductive pillars in the underfill layer.

Referring to FIG. 3C, conductive pillars 34 are formed in the underfill layer 26. In various embodiments, the conductive pillars 34 comprise a conductive material such as copper (Cu) or aluminum (Al). The conductive pillars 34 may be formed by patterning or otherwise removing portions of the underfill layer 26 followed by deposition, electroplating, or other suitable technique.

Figure 3D:
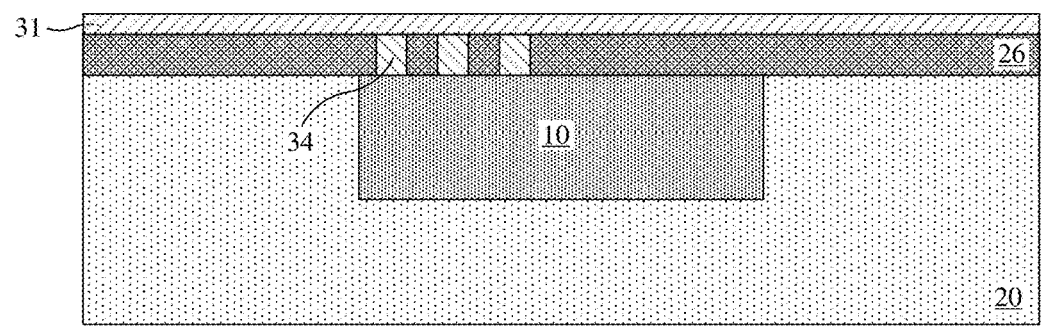

FIG. 3D illustrates a cross-sectional view of the radio frequency device package after forming the lower conductive layer.

Referring to FIG. 3D, a lower conductive layer 31 is formed over the underfill layer 26. The lower conductive layer 26 may be formed using a deposition or electroplating process. In various embodiments, the lower conductive layer comprises a conductive material such as copper (Cu), silver (Ag) and aluminum (Al).

Figure 3E:
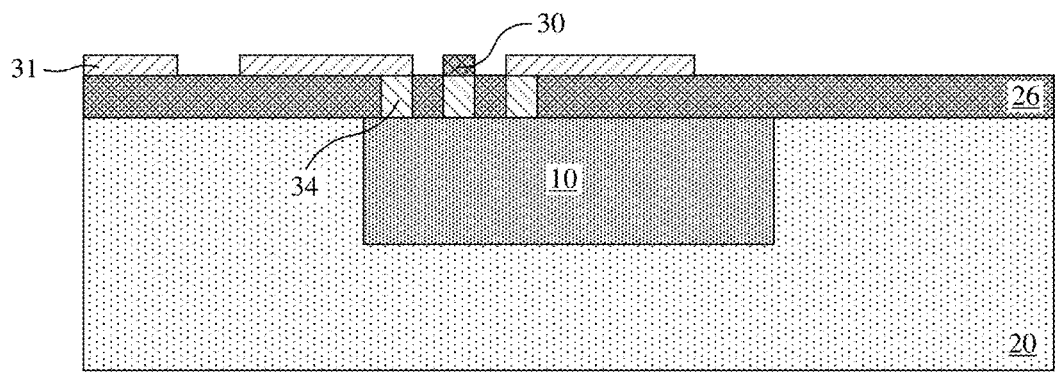

FIG. 3E illustrates a cross-sectional view of the radio frequency device package after patterning the lower conductive layer.

Referring to FIG. 3E, the lower conductive layer 31 may be patterned as previously described to form a redistribution layer (RDL) comprising transmission lines 30. The transmission lines 30 may be as previously described in reference to FIG. 2B.

Figure 3F:
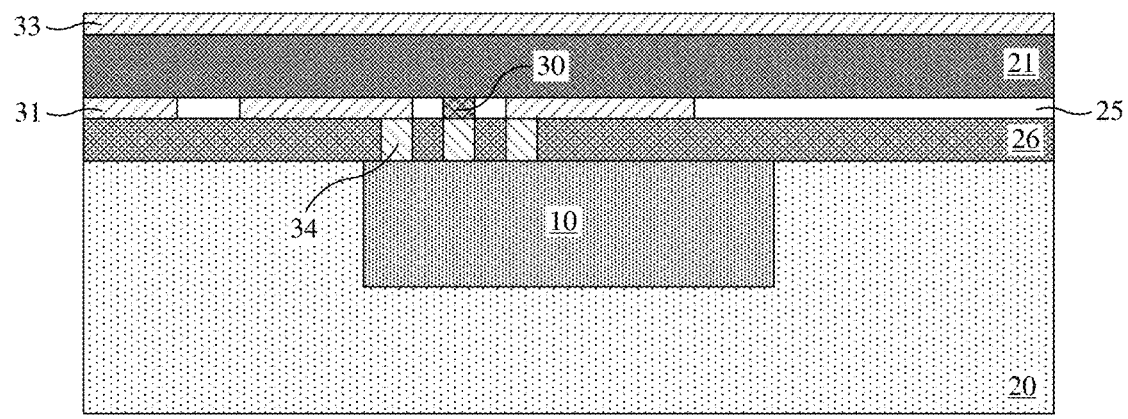

FIG. 3F illustrates a cross-sectional view of the radio frequency device package after forming a solder mask over the underfill layer and forming an upper conductive layer and a lower laminate layer over the solder mask and the lower conductive layer.

Referring to FIG. 3F, a solder mask 25 may be formed over the underfill layer 26 as previously described. A lower laminate layer 21 and an upper conductive layer 33 may then be formed over the solder mask 25 and the lower conductive layer 31. The lower laminate layer 21 and the upper conductive layer 33 may be as previously described. The upper conductive layer 33 may be laminated to the lower laminate layer 21 prior to attachment to the radio frequency device package. As previously discussed, a double-sided or single-sided copper clad laminate material may be utilized to form the lower laminate layer 21 and the upper conductive layer 33. If double-sided copper clad laminate material is used, the conductive foil on one side may be removed prior to attachment to the radio frequency device package.

Figure 3G:
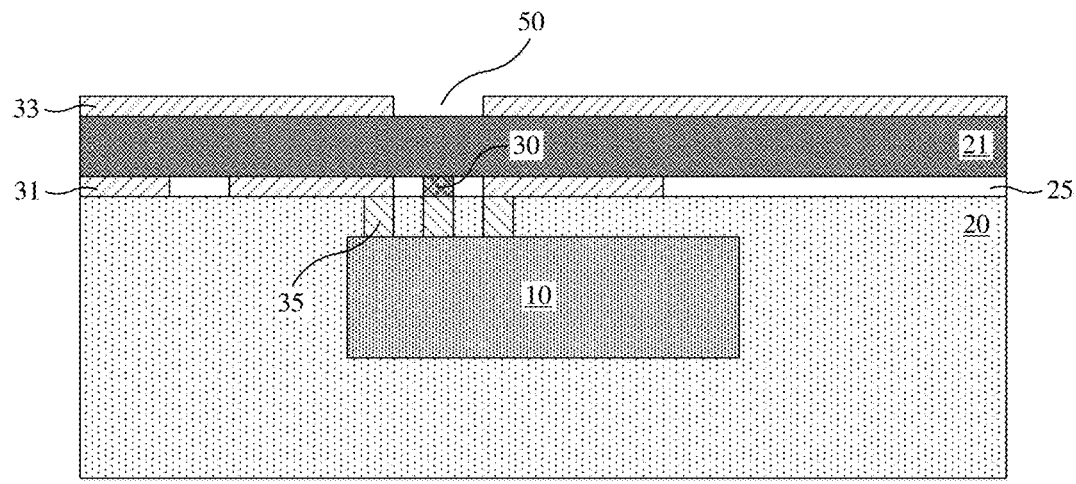

FIG. 3G illustrates a cross-sectional view of the radio frequency device package after patterning the upper conductive layer.

Referring to FIG. 3G, the upper conductive layer 33 may be patterned as previously described to form openings 50 in the upper conductive layer 33.

Figure 3H:
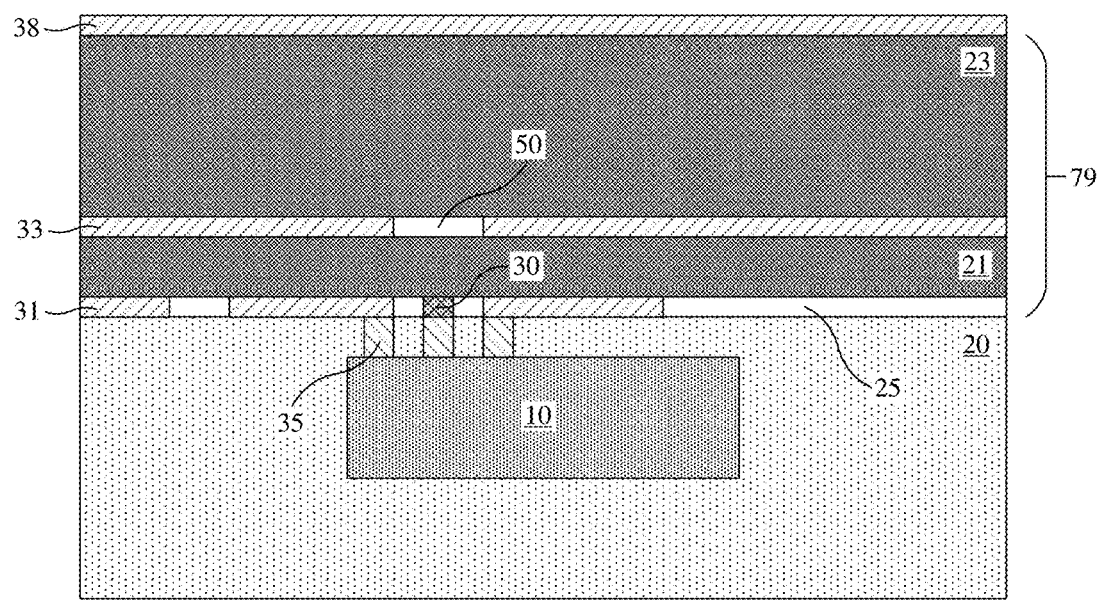

FIG. 3H illustrates a cross-sectional view of the radio frequency device package after forming a conductive antenna layer and an upper laminate layer over the upper conductive layer.

Referring to FIG. 3H, an upper laminate layer 23 and a conductive antenna layer 38 may be formed over the upper conductive layer 33 in a similar process as the lower laminate layer 21 and the upper conductive layer 33. The conductive antenna layer 38 may then be formed and patterned/printed as previously described to form a similar radio frequency device package as illustrated in FIG. 2F.

As previously described in reference to FIG. 2F, the combination of the lower conductive layer 31, lower laminate layer 21, upper conductive layer 33, and upper laminate layer 23 may be considered an antenna substrate 79 in some embodiments.

Figure 4:
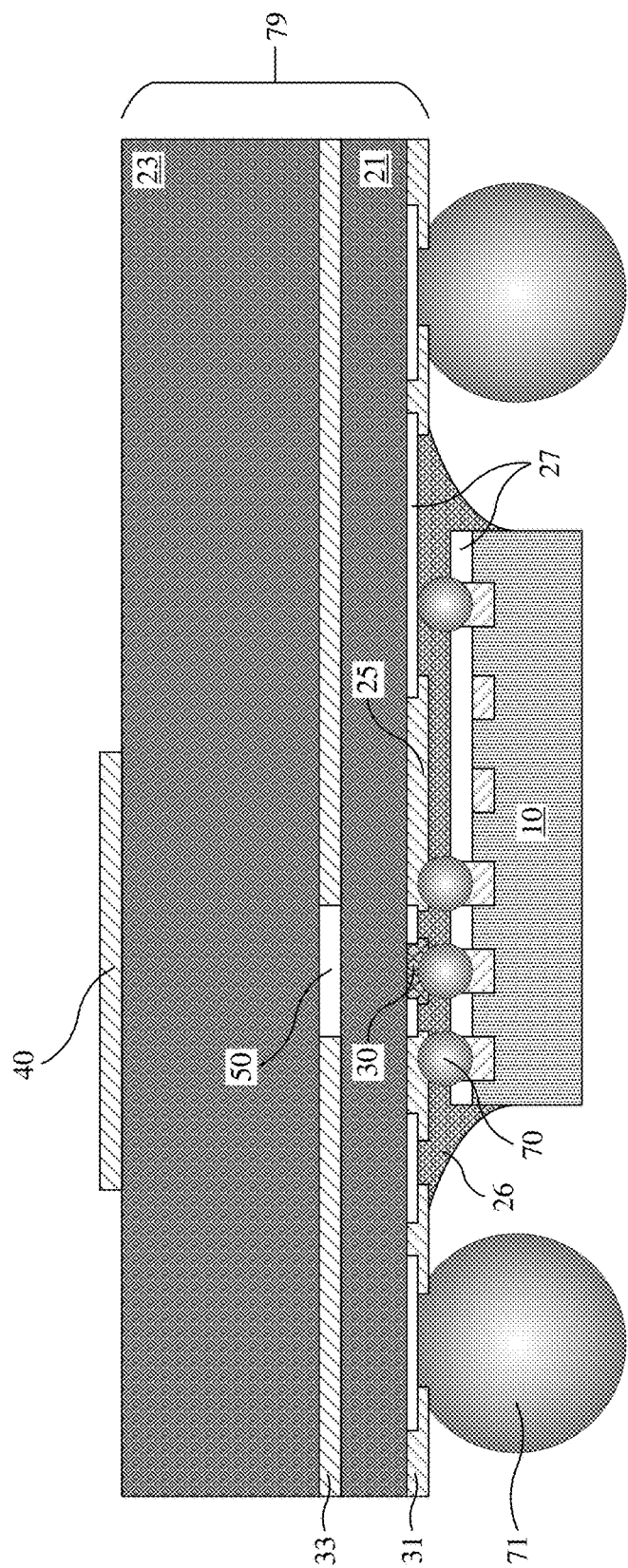
FIG. 4 illustrates a cross-sectional view of an embodiment of a radio frequency device package using a ball grid array in accordance with embodiments of the invention.

FIG. 4 illustrates a cross-sectional view of an embodiment of a radio frequency device package using a ball grid array in accordance with embodiments of the invention. In this embodiment, the molded compound region of previous embodiments is omitted resulting in empty space around the integrated circuit chip.

In this embodiment, the integrated circuit chip 10 may be attached to an antenna substrate 79 after forming the various conductive layers of the antenna and ground plane on the antenna substrate 79. Referring to FIG. 4, antennas 40, an upper laminate layer 23, upper conductive layer 33, lower laminate layer 21, and lower conductive layer 31 may be formed as previously described. The upper conductive layer 33 may include openings 50 and the lower conductive layer 31 may include transmission lines 30 as discussed previously. In various embodiments, passivation regions 27 may be formed and patterned on the respective surfaces of the integrated circuit chip 10 and the lower conductive layer 31 respectively. A number of small solder balls 70 may then be attached to the integrated circuit chip 10. The small solder balls 70 may then be used to attach the integrated circuit chip 10 to the lower conductive layer 31 using a reflow process. Optionally, some or all of the small solder balls 70 may be replaced with copper pillars and be used similarly to attach the integrated circuit chip 10 to the lower conductive layer 31. An underfill layer 26 may also be included as previously described. In various embodiments, the underfill layer 26 is primarily under the integrated circuit chip 10 and does not extend as far laterally as in previous embodiments.

In contrast to previous embodiments, a number of large solder balls 71 may then be used to connect the radio frequency device package to a printed circuit board (PCB). The large solder balls 71 may be part of a ball grid array (BGA). The BGA may also serve to provide vertical separation between the surface of a PCB or other substrate and the integrated circuit chip 10 so that the integrated circuit chip 10 is protected and contact between the integrated circuit chip 10 and the PCB or other substrate is prevented.

Although in FIG. 4, the integrated circuit chip 10 is shown as a bare die, in other embodiments, a packaged IC may be used and copper pillars may be used to couple to the packaged IC instead of solder balls.

FIGS. 5A-5F illustrate another alternative embodiment of fabricating a radio frequency device package in accordance with embodiments of the invention.

Figure 5A:
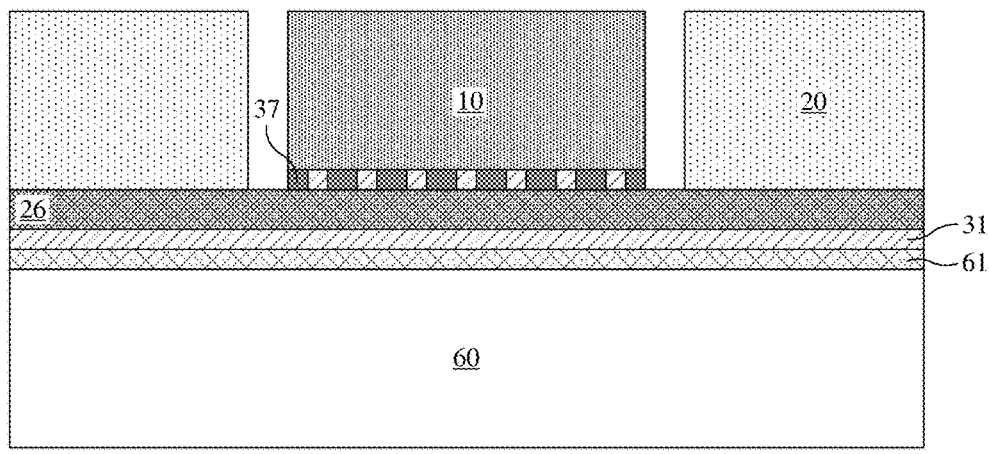

FIG. 5A illustrates a cross-sectional view of the radio frequency device package after attaching a molded compound region and an integrated circuit chip to a lower conductive layer on an adhesive layer on a carrier using an underfill layer.

Referring to FIG. 5A, an integrated circuit chip 10 is attached to a lower conductive layer 31 of a carrier 60 using an underfill layer 26. The carrier 60 and lower conductive layer 31 and bonded together using an adhesive layer 61 as previously described. The integrated circuit chip 10 may also have a redistribution layer 37 to redistribute the connections of integrated devices on the chip for future coupling with layers in the radio frequency device package. In addition to the integrated circuit chip 10, molded compound regions 20 are also attached using the underfill layer 26.

Figure 5B:
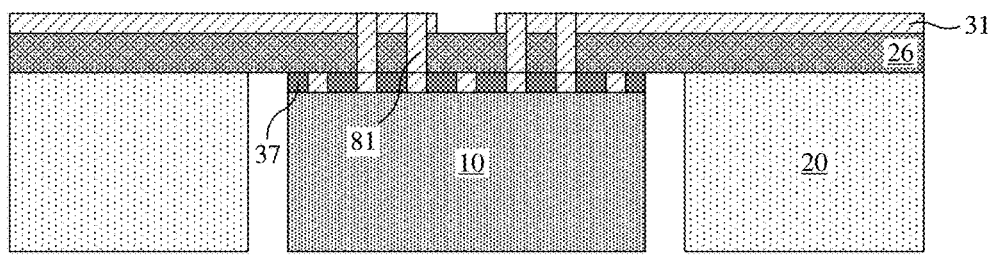

FIG. 5B illustrates a cross-sectional view of the radio frequency device package after detaching the adhesive layer and the carrier, patterning the lower conductive layer, and subsequently forming vias in the underfill layer and the lower conductive layer over the integrated circuit chip.

Referring to FIG. 5B, the adhesive layer 61 and the carrier 60 are removed from the lower conductive layer 31 as previously described and processing begins on the exposed surface of the lower conductive layer 31. The lower conductive layer 31 may then be patterned to form openings using an etching technique or other suitable process. In various embodiments, the lower conductive layer 31 may act as a ground plane to reduce or prevent electromagnetic coupling between the integrated circuit chip 10 and subsequent layers formed over the lower conductive layer 31. First vias 81 may also be formed in the lower conductive layer 31 and the underfill layer 26. The first vias 81 may couple the lower conductive layer 31 to devices and circuitry in the integrated circuit chip 10. The first vias 81 may be formed either only within the underfill layer 26 or in both the underfill layer 26 and the lower conductive layer 31 as shown.

Figure 5C:
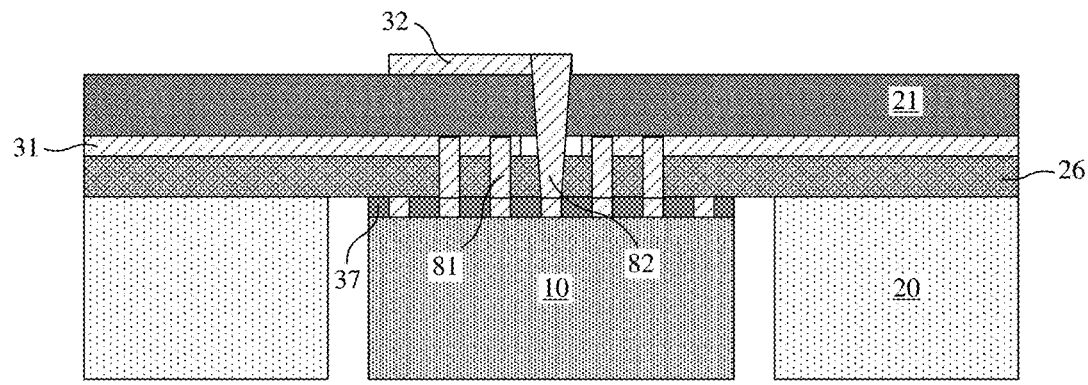

FIG. 5C illustrates a cross-sectional view of the radio frequency device package after forming middle conductive layer and a lower laminate layer over the lower conductive layer, patterning the middle conductive layer, and subsequently forming vias in the middle conductive layer, the lower laminate layer, and the underfill layer over the integrated circuit chip.

Referring to FIG. 5C, a middle conductive layer 32 and a lower laminate layer 21 are formed over the lower conductive layer 31 as previously described for laminate layers and conductive layers such as in reference to FIG. 3F, for example. In various embodiments, the middle conductive layer 32 is patterned to form transmission lines.

In contrast to previous embodiments, the vertical thickness of the lower laminate layer 21 may be between 50 μm and 150 μm in various embodiments. In one embodiment, the vertical thickness of the lower laminate layer 21 is about 100 μm. The vertical thickness of the lower laminate layer 21 may be chosen to optimize transmission line properties in the middle conductive layer 32.

Second vias 82 may be formed passing from the middle conductive layer 32 through the lower laminate layer 21 and the underfill layer 26 and coupling to the integrated circuit chip 10. The openings in the lower conductive layer 31 may serve to prevent the second vias 82 from contacting the ground plane.

Figure 5D:
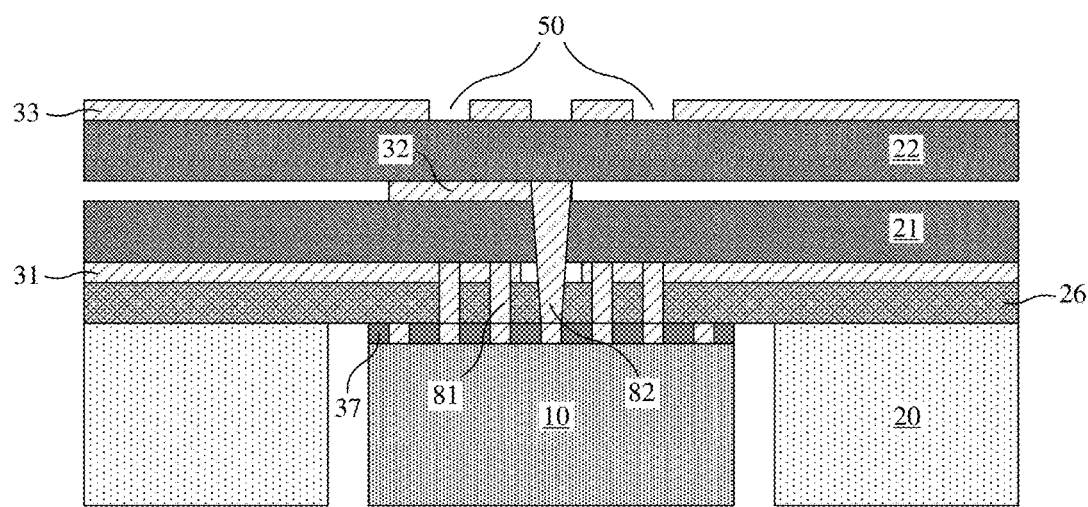

FIG. 5D illustrates a cross-sectional view of the radio frequency device package after forming an upper conductive layer and a middle laminate layer over the middle conductive layer and patterning the upper conductive layer.

Referring to FIG. 5D, an upper conductive layer 33 and a middle laminate layer 22 are formed over the middle conductive layer 32 using previously described processes for laminate layers and conductive layers such as in reference to FIG. 3F, for example. Also as previously described, the upper conductive layer 33 may be patterned to form openings 50 in the upper conductive layer 33. In various embodiments the upper conductive layer 33 and the openings 50 are a second ground layer which may facilitate the transfer of electromagnetic signals through the openings 50 and the middle laminate layer 22 and to the middle conductive layer 32.

Figure 5E:
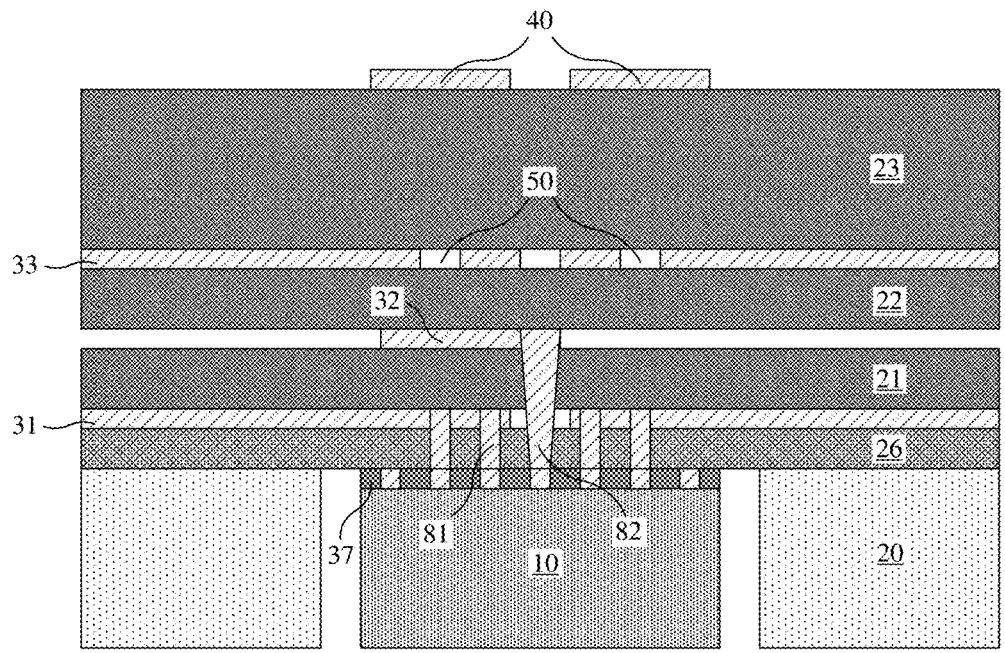

FIG. 5E illustrates a cross-sectional view of the radio frequency device package after forming a conductive antenna layer and an upper laminate layer and patterning the conductive antenna layer to form antennas over the upper laminate layer.

Referring to FIG. 5E, a conductive antenna layer and an upper laminate layer 23 are formed over the upper conductive layer 33 using previously described processes for laminate layers and conductive layers such as in reference to FIG. 3F, for example. The conductive antenna layer is then patterned or otherwise directly printed to form antennas 40 as previously described. In various embodiments, the antennas 40 are aligned vertically with the openings 50 in the upper conductive layer 33.

In particular, the antennas 40 may completely overlap the openings 50 except for a central opening as shown in FIG. 5E, for example. The openings that are aligned with antennas may restrict electromagnetic signals to a defined are such as antennas or transmission lines. Electromagnetic signals that are incident on the upper conductive layer 33 may be dissipated by the ground connection of the upper conductive layer 33. More or fewer openings may also be included in the upper conductive layer 33 and may depend on the number of antennas 40. The size of the openings 50 may depend on the distance between the upper conductive layer 33 and the antennas 40 which is the thickness of the upper laminate layer 23 and also depend on the size of the antennas 40.

Alternatively, the described structure that includes the three laminate layers (lower laminate layer 21, middle laminate layer 22, and upper laminate layer 23) and four patterned conductive layers (lower conductive layer 31, middle conductive layer 32, upper conductive layer 33, and antennas 40) may be formed using other possible combinations of copper clad laminate sheets. For example, the middle laminate layer 22 may be formed over the middle conductive layer 32 without the upper conductive layer 33. Double-sided copper clad laminate material may then be used for the combination of the upper laminate layer 23, upper conductive layer 33, and antennas 40. The double-sided copper clad laminate material may then be patterned to form openings, attached to the middle laminate layer 22, and patterned to form antennas 40. Optionally, both conductive layers may be patterned before attaching the structure to the middle laminate layer 22. Other process flows are also possible and would be apparent to one of skill in the art.

Figure 5F:
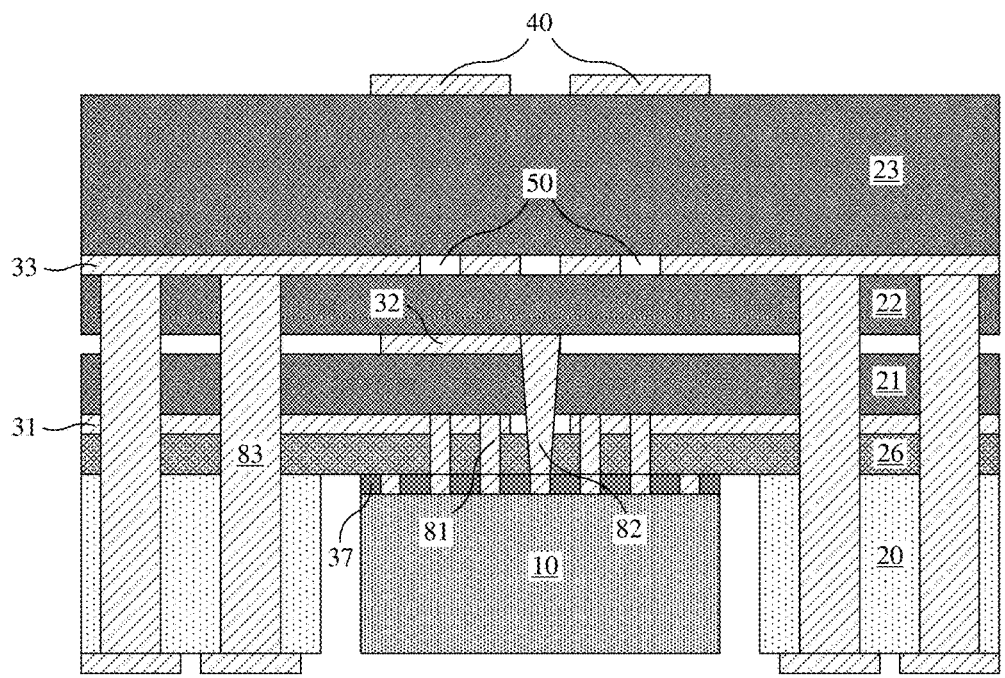

FIG. 5F illustrates a cross-sectional view of the radio frequency device package after forming vias in the middle laminate layer, the lower laminate layer, the underfill layer, and the molded compound region.

Referring to FIG. 5F, large vias 83 may be formed in the conductive layers, laminate layers, and the molded compound region as previously described. The large vias 83 may allow the attachment of the radio frequency device package to a printed circuit board (PCB) or other suitable substrate using a ball grid array (BGA) or other suitable method. The large vias 83 may also allow coupling of the conductive layers to contacts on the printed circuit board (PCB) or other suitable substrate.

In various embodiments, the large vias 83 may be separate vias formed during the intermediate stages of the radio frequency device process. For example, the portions of the large vias 83 that connect the upper conductive layer 33 and the lower conductive layer 31 may be formed before the upper laminate layer 23 is formed. Additionally, the large vias 83 may provide various benefits such as suppressing parallel plate modes between the upper conductive layer 33 and the lower conductive layer 31 by electrically coupling the upper conductive layer 33 and the lower conductive layer 31.

Figure 6A:
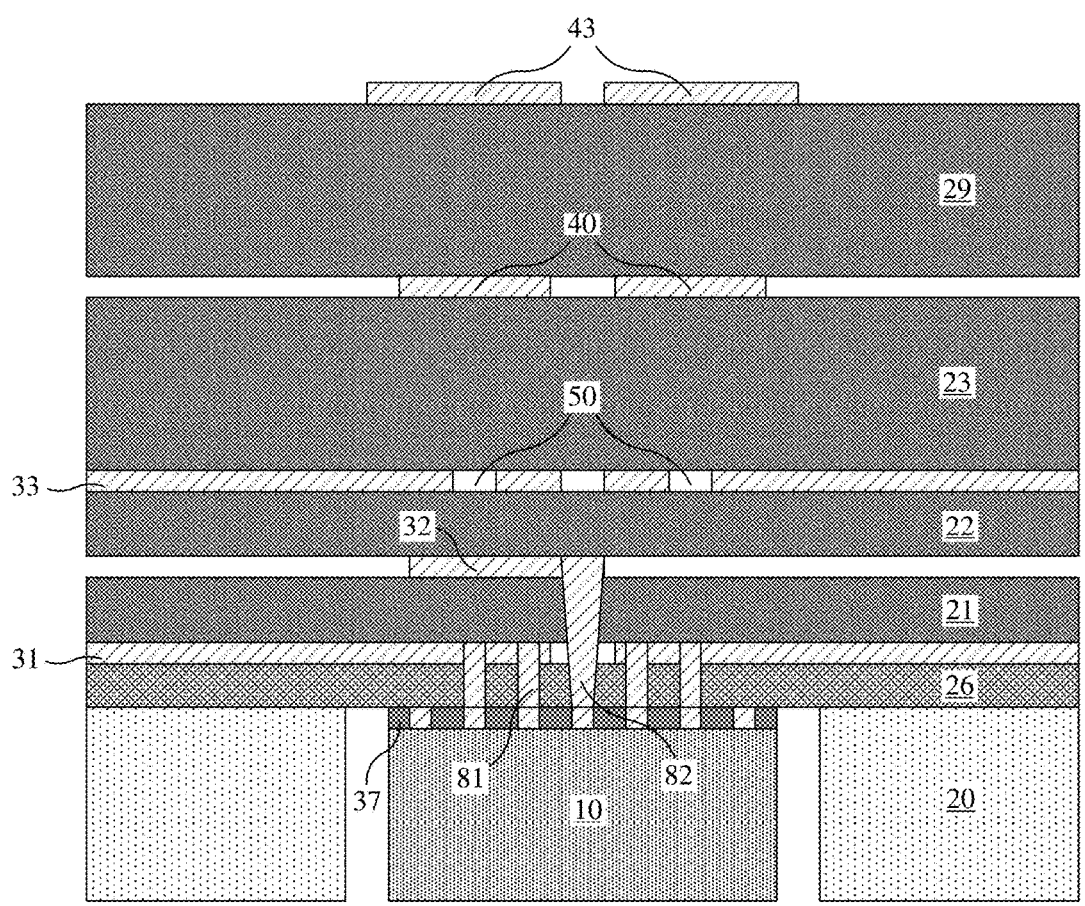
Figure 6B:
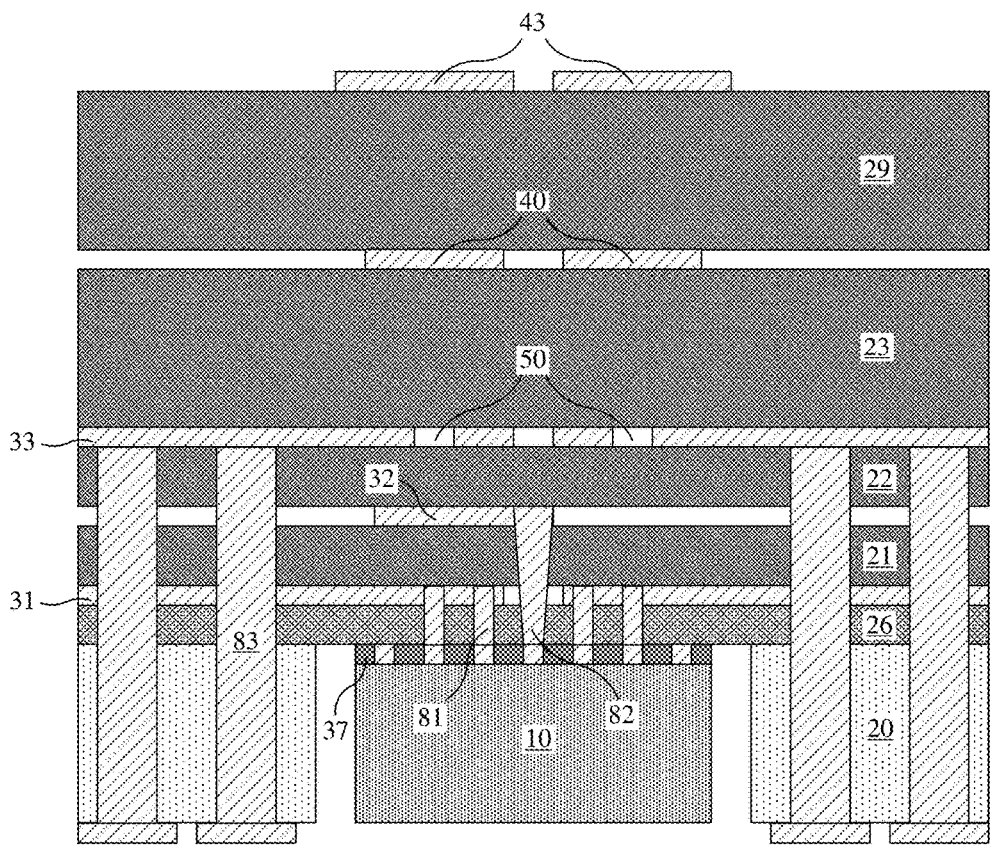

FIGS. 6A and 6B illustrate still another alternative embodiment of fabricating a radio frequency device package in accordance with an embodiment of the invention.

FIG. 6A illustrates a cross-sectional view of the radio frequency device package after forming a second conductive antenna layer and a second upper laminate layer and patterning the second conductive antenna layer to form additional antennas over the second upper laminate layer.

Referring to FIG. 6A, a radio frequency device package such as illustrated in FIG. 5F may include multiple antenna layers rather than a single antenna layer. For example, a second conductive antenna layer and a second upper laminate layer 29 may be formed over the antennas 40 of the radio frequency device package using previously described processes for laminate layers and conductive layers such as in reference to FIG. 3F, for example. The second conductive antenna layer may then be patterned to form additional antennas 43.

The multilayer stacking of patch antennas such as antennas 40 and additional antennas 43 may enhance the gain of the radio frequency device. If the antennas dimensions are different for different layers, the bandwidth of the radio frequency device may also be enhanced. Furthermore, the multilayer configuration is not limited to only two antenna layers. Any number of layers is possible depending on the needs of the radio frequency device such as package size, bandwidth, gain, and cost requirements, for example.

FIG. 6B illustrates a cross-sectional view of the radio frequency device package after forming vias in the middle laminate layer, the lower laminate layer, the underfill layer, and the molded compound region. At this step, large vias 83 are formed as previously described in reference to FIG. 5F.

Figure 7A:
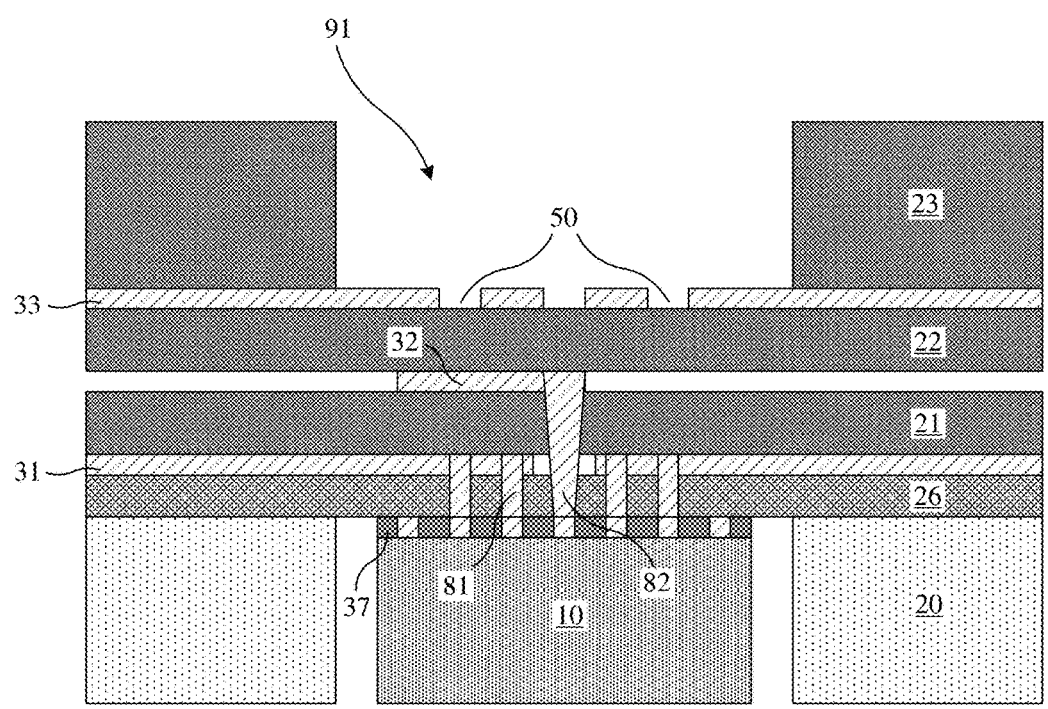
Figure 7B:
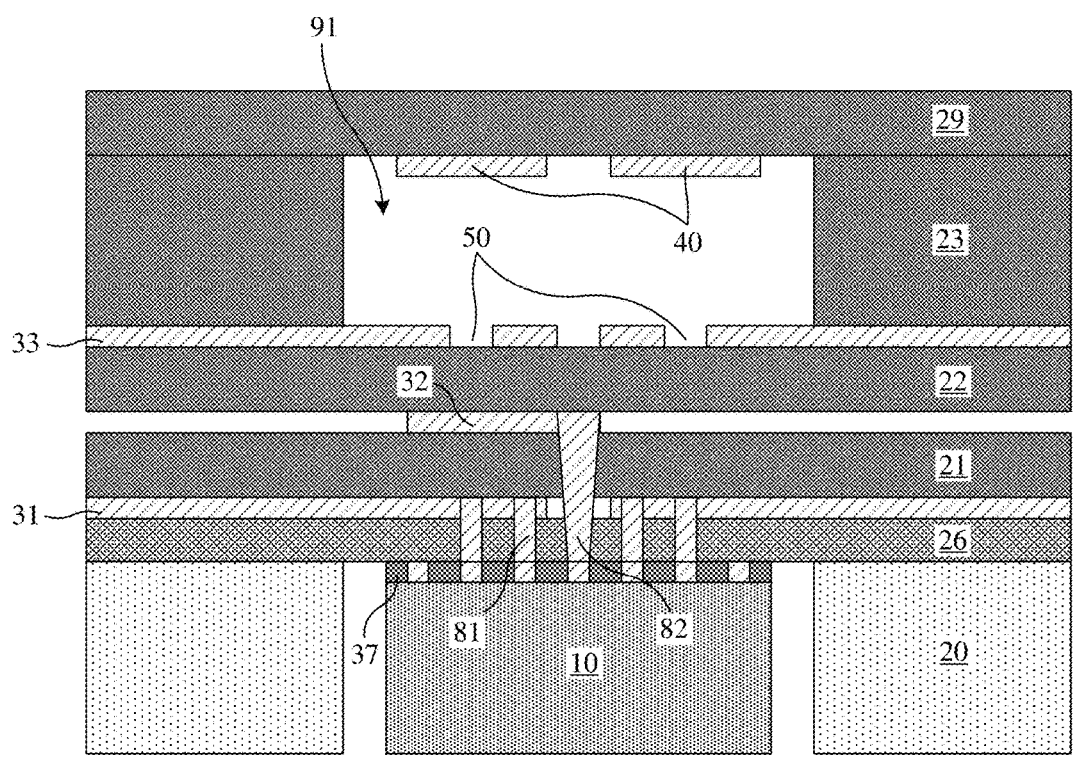
Figure 7C:
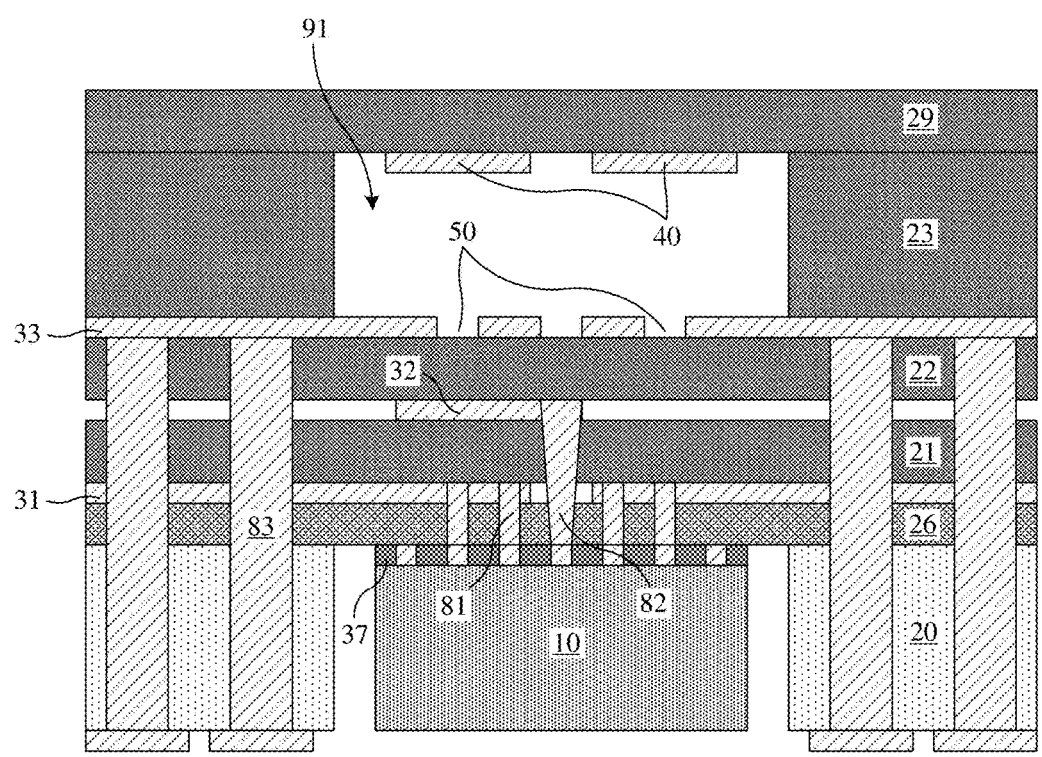

FIGS. 7A-7C illustrate yet another alternative embodiment of fabricating a radio frequency device package in accordance with an embodiment of the invention.

FIG. 7A illustrates a cross-sectional view of the radio frequency device package after forming an upper laminate layer with a cavity over the upper conductive layer.

Referring to FIG. 7A, an upper laminate layer 23 is formed over an upper conductive layer 33 using previously described processes. In various embodiments, a cavity 91 in the upper laminate layer 23 may be present above the upper conductive layer 33. The cavity 91 may be formed by laminating separate sections of upper laminate layer 23. Alternatively, the cavity 91 may be formed through other means such as etching or laser drilling, for example.

FIG. 7B illustrates a cross-sectional view of the radio frequency device package after forming a conductive antenna layer on a second upper laminate layer, patterning the conductive antenna layer to form antennas, and attaching the second upper laminate layer over the upper laminate layer.

Referring to FIG. 7B, a conductive antenna layer is patterned to form antennas 40 on a second upper laminate layer 29. The second upper laminate layer 29 is then attached to the upper laminate layer 23 such that the antennas are vertically aligned with the cavity 91 in the upper laminate layer. The cavity 91 may be hermetically sealed and may include a gas. In one embodiment, the antennas 40 are on an interior surface of the second upper laminate layer 29. In this embodiment, air is the dielectric material that separates the openings 50 and the antennas 40. This embodiment may advantageously increase the gain of the radio frequency device. Additionally, the antennas may have a reduced dissipation factor due to the gas which may promote high radiation efficiency (and low losses) for the antennas. The reduced dielectric constant of air compared to other materials may also increase bandwidth of the radio frequency device.

FIG. 7C illustrates a cross-sectional view of the radio frequency device package after forming vias in the middle laminate layer, the lower laminate layer, the underfill layer, and the molded compound region. At this step, large vias 83 are formed as previously described in reference to FIG. 5F.

Figure 8A:
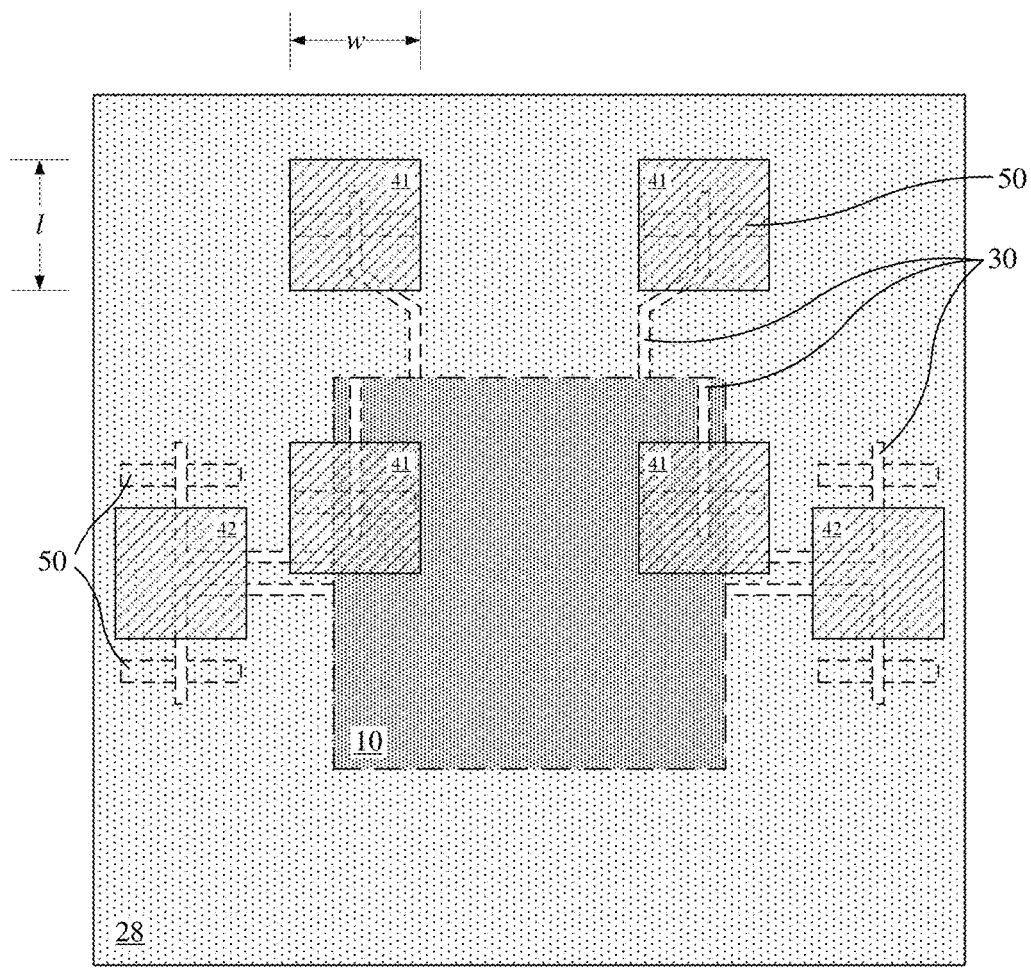
Figure 8B:
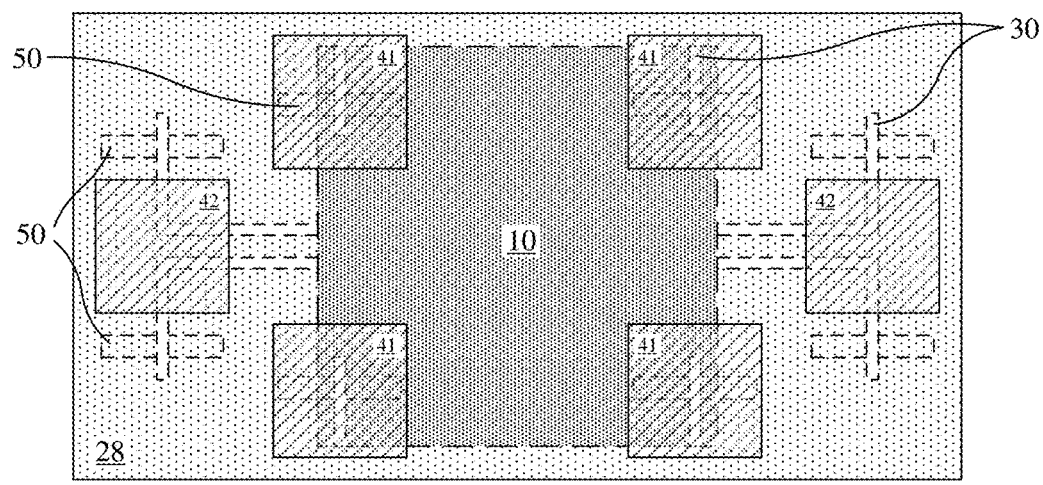
Figure 8C:
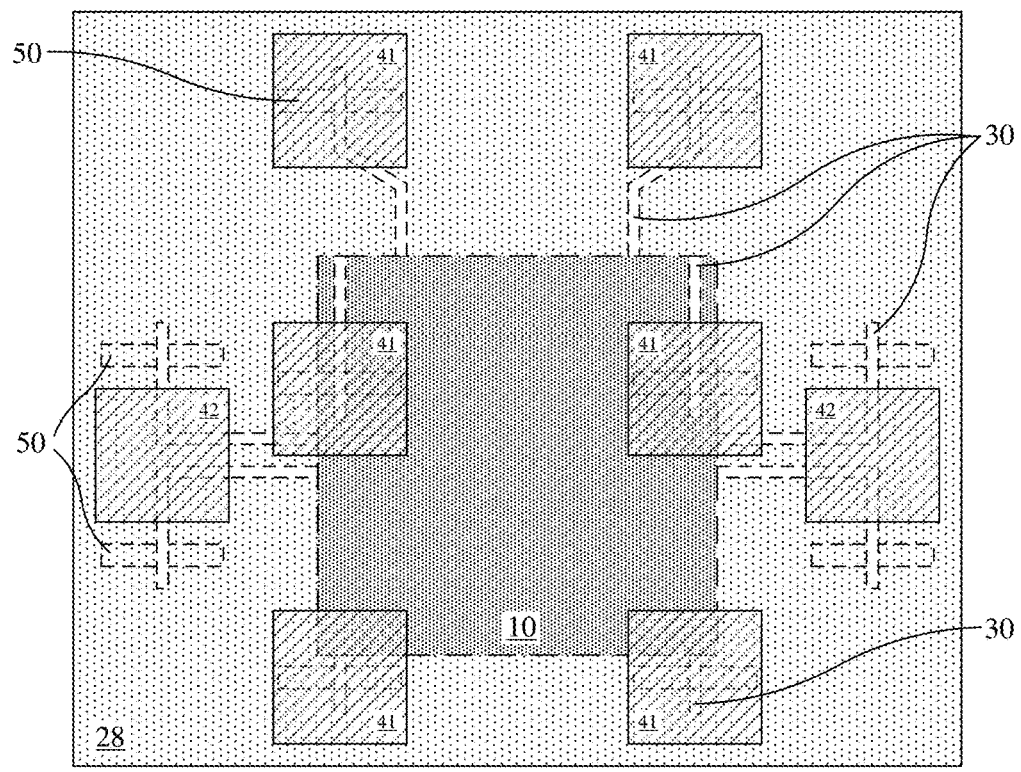

FIGS. 8A-8C illustrate several embodiments of a radio frequency device package in accordance with embodiments of the invention where FIGS. 8A-8C illustrate top views of the several embodiments.

Referring to FIG. 8A, a radio frequency device package is shown including a device package 28 with receiving antennas 41 and transmitting antennas 42 disposed above an integrated circuit chip 10. In one embodiment the antennas are disposed over the device package 28. The antennas may be located partially or directly over the integrated circuit chip 10.

The shape and size of the antennas may vary with application such as desired frequency response and bandwidth of the radio frequency device, as examples. The antennas do not have to be the same size or shape.

The device package 28 encases the integrate circuit chip 10. In various embodiments, the device package 28 may comprise several layers. In various embodiments, the device package 28 may comprise an epoxy resin, a blended resin, and/or a polyimide. In some embodiments the device package may comprise an epoxy molding compound (EMC). In various embodiments, layers in the device package 28 may comprise a low-loss high-frequency laminate material such as woven glass reinforced hydrocarbon ceramics and/or polytetrafluoroethylene (PTFE), for example. The device package 28 may serve to increase the overall footprint of the device allowing for mounting on a printed circuit board (PCB) using reflow solder techniques such as using a ball grid array (BGA), for example.

Still referring to FIG. 8A, transmission lines 30 are included to couple the devices on the integrated circuit chip 10 to the receiving antennas 41 and transmitting antennas 42. The transmission lines 30 may be located on the interior of the device package 28 in a 3-dimensional package structure. The transmission lines 30 may be in a microstrip, stripline, coplanar waveguide, or other suitable configuration. The transmission lines 30 may serve to propagate an electromagnetic signal between a receiving antenna 41 or a transmitting antenna 42 and the integrated circuit chip 10.

Conductive layers (not shown) may be included between the integrated circuit chip 10 and the antennas. Some of the conductive layers may be ground planes to prevent undesirable coupling between components. Openings 50 in the ground plane layers are included to electromagnetically couple the antenna patches to the integrated circuit chip by guiding the received and transmitted signals to and from the transmission lines 30.

Referring to FIGS. 8B and 8C, radio frequency device packages are shown with possible alternative antenna configurations. These alternative configurations are given as examples only. The arrangement and number of receiving antennas and transmitting antennas is not limited to the configurations illustrated in FIGS. 8A-8C. The radio frequency device package may include more antennas or fewer antennas in various positions relative to the integrate circuit chip 10 and relative to other antennas.

The overall size of the device package 28 may be reduced since antennas may be located directly over the integrated circuit chip 10. For example, if no antennas are directly located over the integrated circuit chip, the size of the device package may be about 9 mm×13 mm. When antennas are located directly above the integrated circuit chip, the size of the device package is about 8 mm×8 mm in one embodiment. The reduction in size is a result of moving the antennas from the fan out region to regions overlapping the integrated circuit chip. In an alternative embodiment, the size of the device package is about 7 mm×7 mm. In another alternative embodiment, the size of the device package is about 7 mm×5 mm. Other package sizes are conceivable depending on the antenna requirements of the radio frequency device. For example, package size is related to the size and number of antennas which depends on the desired frequency.

The reduction in area of the device package 28 may also be described using a ratio of the device package area to the integrated circuit chip area. For example, if no antennas are directly located over the integrate circuit chip, the ratio of the device package area to the integrated circuit chip area is about 4.7:1. In various embodiments, antennas are located directly above the integrated circuit chip and the ratio of the device package area to the integrated circuit chip area is between 3:1 and 1:1. In one embodiment, the ratio of the device package area to the integrated circuit chip area is about 2.5:1. In another embodiment, the ratio of the device package area to the integrated circuit chip area is about 2:1. In still another embodiment, the ratio of the device package area to the integrated circuit chip area is about 1.4:1.

The three-dimensional (3D) integration of antennas may also advantageously provide more flexibility in routing transmission lines and easier phase compensation which may improve the performance of the radio frequency device. Another possible benefit of 3D integration of antennas is that the design is independent of the printed circuit board (PCB) material. This may allow more freedom in choosing optimal low-loss, high frequency materials and result in better performance of the radio frequency device.

Furthermore, 3D integration of antennas may not require a ground plane of the PCB for the antenna array. Instead, specialized ground planes may be incorporated as previously mentioned between the integrated circuit chip and the antenna array. This may advantageously allow the antenna bandwidth and the transmission line properties to be independent parameters in the design process. For example, antenna bandwidth may be influenced primarily by layers above the ground plane whereas transmission line properties may be influenced primarily by layers below the ground plane. If the ground plane is on a separate PCB, the antenna bandwidth and transmission line properties may be restricted. For example, if the ground plane is on the PCB, the distance between the antenna and the ground plane can vary depending on external factors such as the amount of soldering reflow.

Figure 9:
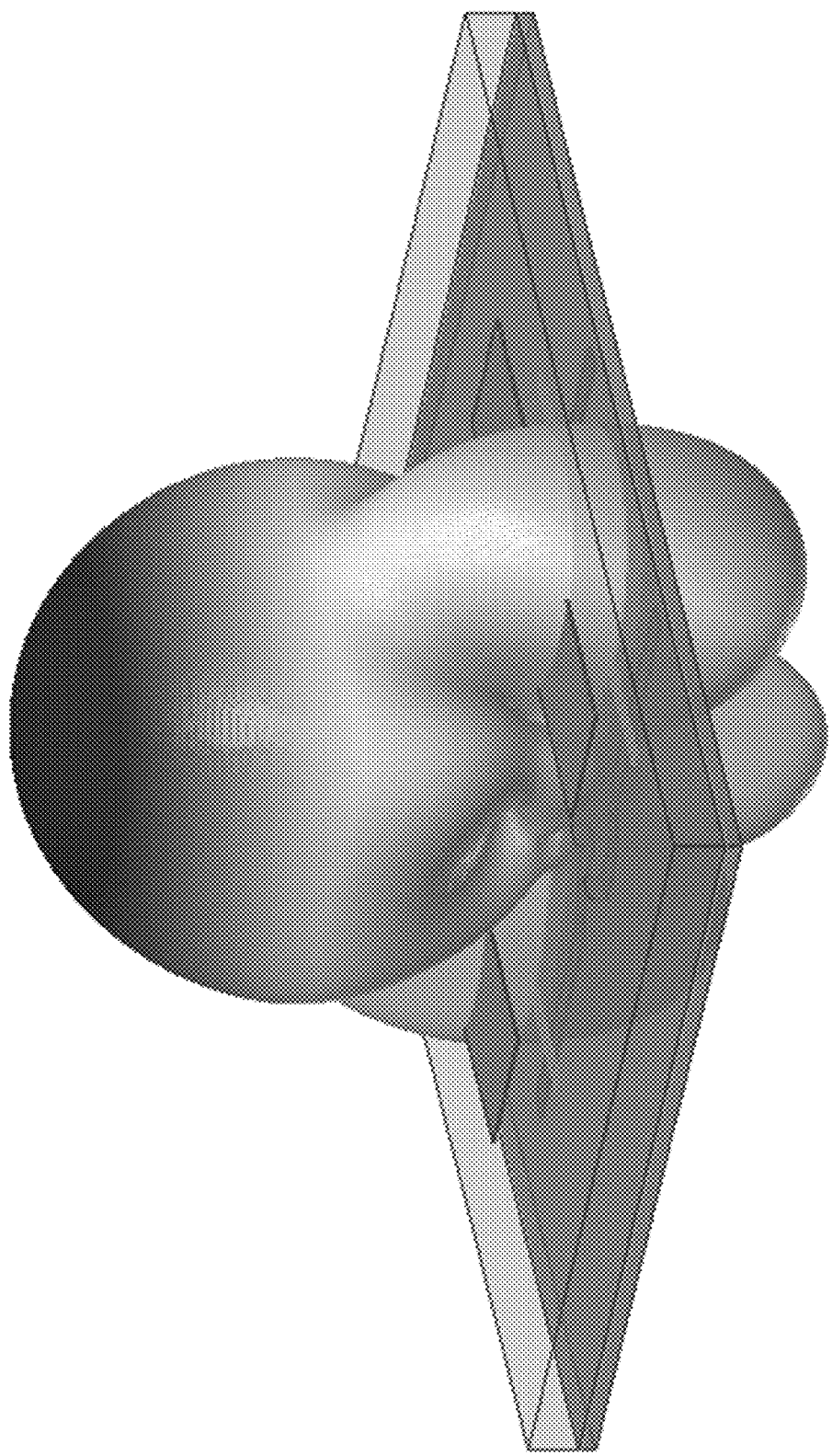
FIG. 9 illustrates a three-dimensional view of a radiation pattern of a radio frequency device package.

FIG. 9 illustrates a three-dimensional view of a radiation pattern of a radio frequency device package.

Referring to FIG. 9, a radiation pattern is shown that may be produced from a radio frequency device package such as illustrated in FIG. 8A. The placement of the antennas on the radio frequency device package may affect the radiation pattern. In some applications, a symmetric radiation pattern that is located primarily on a single side of the device is desirable. However, it is possible to create a variety of radiation patterns. The antenna patterns and radiation patterns described herein are simply examples and not meant to be limiting.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device package comprising:
  an integrated circuit chip comprising a radio frequency device, wherein the radio frequency device comprises active circuitry at a first surface of the integrated circuit chip; and
  an antenna substrate disposed over the first surface of the integrated circuit chip, the antenna substrate comprising
    a first conductive layer disposed over the first surface of the integrated circuit chip, wherein the first conductive layer comprises a first transmission line electrically coupled to the integrated circuit chip,
    a first laminate layer disposed over the first conductive layer, wherein the first laminate layer overlaps a first part of the first transmission line,
    a second conductive layer disposed over the first laminate layer, wherein the second conductive layer comprises a first opening overlapping a second part of the first transmission line,
    a second laminate layer disposed over the second conductive layer,
    a first antenna disposed over the second laminate layer and overlapping the first opening, the second part of the first transmission line, and the integrated circuit chip,
    a second transmission line disposed in the first conductive layer, and
    a second antenna disposed over the second laminate layer and overlapping a part of the second transmission line.

2. The semiconductor device package of claim 1, further comprising an underfill layer disposed between the integrated circuit chip and the first conductive layer.

3. The semiconductor device package of claim 1, wherein the second conductive layer is a ground plane.

4. The semiconductor device package of claim 1, wherein the antenna substrate further comprises a second opening in the second conductive layer, wherein the second opening overlaps the part of the second transmission line, and wherein the second antenna overlaps the second opening.

5. The semiconductor device package of claim 4, wherein the second antenna overlaps the integrated circuit chip.

6. The semiconductor device package of claim 4, wherein the second antenna does not overlap the integrated circuit chip.

7. The semiconductor device package of claim 1, further comprising a conductive pillar electrically coupled to the integrated circuit chip and the first conductive layer.

8. The semiconductor device package of claim 1, further comprising a molded compound region, wherein the integrated circuit chip is disposed in the molded compound region.

9. The semiconductor device package of claim 8, further comprising a via disposed in the molded compound region and electrically coupled to the second conductive layer.

10. The semiconductor device package of claim 1, further comprising:
  a small solder ball disposed between and electrically coupled to the integrated circuit chip and the first conductive layer; and
  a large solder ball disposed adjacent to the integrated circuit chip and electrically coupled to the first conductive layer, wherein a maximum vertical height of the large solder ball is greater than a maximum vertical height of the integrate circuit chip.

11. The semiconductor device package of claim 1, further comprising:
  a third conductive layer disposed between the integrated circuit chip and the first conductive layer; and
  a third laminate layer disposed between the third conductive layer and the first conductive layer, wherein the third conductive layer is electrically coupled to the integrated circuit chip, and wherein the third conductive layer is a ground plane.

12. The semiconductor device package of claim 1,
wherein the semiconductor device package further comprises an antenna feeding coupled to the first antenna,
wherein a width of the antenna feeding is about 90 μm,
wherein a width of the first opening is about 150 μm,
wherein a width of the first antenna is about 850 μm and a length of the first antenna is about 1500 μm,
wherein a vertical thickness of the first laminate layer is between 20 μm and 200 μm, and
wherein a vertical thickness of the second laminate layer is between 40 μm and 400 μm.

13. A method of assembling a semiconductor device package, the method comprising:
forming an integrated circuit chip comprising a radio frequency device, wherein the radio frequency device comprises active circuitry at a first surface of the integrated circuit chip;
forming a first conductive layer over the first surface of the integrated circuit chip;
patterning the first conductive layer to form a first transmission line electrically coupled to the integrated circuit chip;
forming a first laminate layer over the first conductive layer, wherein the first laminate layer overlaps a first part of the first transmission line;
forming a second conductive layer over the first laminate layer;
forming a first opening in the second conductive layer, wherein the first opening overlaps a second part of the first transmission line;
forming a second laminate layer over the second conductive layer;
forming a first antenna over the second laminate layer overlapping the first opening, the second part of the first transmission line, and the integrated circuit chip;
forming a second transmission line in the first conductive layer during the patterning of the first conductive layer; and
forming a second antenna over the second laminate layer and overlapping a part of the second transmission line.

14. The method of claim 13, further comprising:
forming a second opening in the second conductive layer, wherein the second opening overlaps the part of the second transmission line, and wherein the second antenna overlaps the second opening.

15. The method of claim 13, further comprising forming a conductive pillar electrically coupled to the integrated circuit chip, the first transmission line, and the second transmission line.

16. The method of claim 13, further comprising forming a molded compound region enclosing the integrated circuit chip.

17. The method of claim 16, further comprising forming a via in the molded compound region, wherein the via is electrically coupled to the second conductive layer.

18. The method of claim 13, further comprising:
forming a small solder ball or a copper pillar between the integrated circuit chip and the first conductive layer, wherein the small solder ball or the copper pillar is electrically coupled to the integrated circuit chip and the first conductive layer; and
forming a large solder ball adjacent to the integrated circuit chip and electrically coupled to the first conductive layer, wherein a maximum vertical height of the large solder ball is greater than a maximum vertical height of the integrate circuit chip.

19. The method of claim 13, further comprising:
forming a third conductive layer between the integrated circuit chip and the first conductive layer; and
forming a third laminate layer between the third conductive layer and the first conductive layer, wherein the third conductive layer is electrically coupled to the integrated circuit chip, and wherein the third conductive layer is a ground plane.

20. The method of claim 13, further comprising:
forming a third laminate layer over the first antenna; and
forming a third antenna over the third laminate layer, wherein the third antenna is directly over the first antenna.

21. The method of claim 13, further comprising:
forming a third laminate layer between the second conductive layer and the second laminate layer; and
forming a cavity in the third laminate layer, wherein the cavity overlaps a second part of the first transmission line, and wherein the first antenna is disposed on a surface of the second laminate layer that is inside the cavity.

22. A system comprising:
a printed circuit board;
an integrated circuit chip comprising a radio frequency receiver, transmitter, or transceiver;
a first ground plane located above the integrated circuit chip;
a transmission slot in the first ground plane;
an antenna located above the first ground plane, wherein the antenna overlaps the integrated circuit chip, and wherein the antenna is directly above the transmission slot;
a transmission line between the integrated circuit chip and the first ground plane, wherein the transmission line is electrically coupled to the integrated circuit chip, and wherein the transmission line is electromagnetically coupled to the antenna;
a package region, wherein the integrated circuit chip, the transmission line, the first ground plane, and the antenna are in the package region; and
a via disposed in the package region and electrically coupled to the first ground plane, the via extending from the first ground plane to an outer surface of the package region.

23. The system of claim 22, further comprising a second ground plane between the integrated circuit chip and the transmission line.

24. The system of claim 22, wherein transmission energy from the transmission line is electromagnetically coupled to the transmission slot, wherein the antenna radiates energy from the transmission slot by electromagnetic coupling.

25. The system of claim 22, wherein the printed circuit board does not have a ground plane for the antenna.

26. The system of claim 22, further comprising:
an additional transmission slot in the first ground plane;
an additional antenna located above the first ground plane, wherein the additional antenna is directly above the additional transmission slot; and
an additional transmission line between the integrated circuit chip and the first ground plane, wherein the transmission line is electrically coupled to the integrated circuit chip and electromagnetically coupled to the additional antenna.

27. A semiconductor device package comprising:
an integrated circuit chip comprising a radio frequency device, wherein the radio frequency device comprises active circuitry at a first surface of the integrated circuit chip; and an antenna substrate disposed over the first surface of the integrated circuit chip, the antenna substrate comprising
- a first conductive layer disposed over the first surface of the integrated circuit chip, wherein the first conductive layer comprises a first transmission line electrically coupled to the integrated circuit chip,
- a first laminate layer disposed over the first conductive layer, wherein the first laminate layer overlaps a first part of the first transmission line,
- a second conductive layer disposed over the first laminate layer, wherein the second conductive layer comprises a first opening overlapping a second part of the first transmission line,
- a second laminate layer disposed over the second conductive layer,
- a first antenna disposed over the second laminate layer and overlapping the first opening, the second part of the first transmission line, and the integrated circuit chip,
- a third laminate layer disposed over the first antenna, and
- a second antenna disposed over the third laminate layer, wherein the second antenna is directly over the first antenna.

28. A semiconductor device package comprising:
an integrated circuit chip comprising a radio frequency device, wherein the radio frequency device comprises active circuitry at a first surface of the integrated circuit chip; and an antenna substrate disposed over the first surface of the integrated circuit chip, the antenna substrate comprising
- a first conductive layer disposed over the first surface of the integrated circuit chip, wherein the first conductive layer comprises a first transmission line electrically coupled to the integrated circuit chip,
- a first laminate layer disposed over the first conductive layer, wherein the first laminate layer overlaps a first part of the first transmission line,
- a second conductive layer disposed over the first laminate layer, wherein the second conductive layer comprises a first opening overlapping a second part of the first transmission line,
- a second laminate layer disposed over the second conductive layer,
- a cavity disposed in the second laminate layer, wherein the cavity overlaps a third part of the first transmission line, and
- a third laminate layer disposed over the second laminate layer,
- a first antenna disposed on a surface of the third laminate layer that is inside the cavity and overlapping the first opening, the second part of the first transmission line, and the integrated circuit chip.

* * * * *